United States Patent
Kuo et al.

(10) Patent No.: US 11,232,971 B2
(45) Date of Patent: Jan. 25, 2022

(54) WORKPIECE HOLDING MECHANISM, PROCESS SYSTEM AND MANUFACTURING METHOD OF SEMICONDUCTOR STRUCTURE

(71) Applicant: Taiwan Semiconductor Manufacturing Co., Ltd., Hsinchu (TW)

(72) Inventors: Hung-Jui Kuo, Hsinchu (TW); Hui-Jung Tsai, Hsinchu (TW); Keng-Han Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 12 days.

(21) Appl. No.: 16/718,207

(22) Filed: Dec. 18, 2019

(65) Prior Publication Data

US 2021/0193499 A1    Jun. 24, 2021

(51) Int. Cl.
*H01L 21/683* (2006.01)
*H01L 21/687* (2006.01)
*G01R 31/28* (2006.01)

(52) U.S. Cl.
CPC .... *H01L 21/6838* (2013.01); *H01L 21/68721* (2013.01); *G01R 31/2889* (2013.01); *G01R 31/2893* (2013.01)

(58) Field of Classification Search
CPC ......... H01L 21/68721; H01L 21/68735; H01L 21/6838; C23C 16/4585; G01R 31/2889; G01R 31/2893
See application file for complete search history.

(56) References Cited

U.S. PATENT DOCUMENTS

| 5,203,958 | A | * | 4/1993 | Arai | H01L 21/67069 |
| | | | | | 216/67 |
| 5,695,566 | A | * | 12/1997 | Suzuki | C23C 14/50 |
| | | | | | 118/723 E |
| 9,000,584 | B2 | | 4/2015 | Lin et al. | |
| 9,048,222 | B2 | | 6/2015 | Hung et al. | |
| 9,048,233 | B2 | | 6/2015 | Wu et al. | |
| 9,064,879 | B2 | | 6/2015 | Hung et al. | |
| 9,111,949 | B2 | | 8/2015 | Yu et al. | |
| 9,263,511 | B2 | | 2/2016 | Yu et al. | |
| 9,281,254 | B2 | | 3/2016 | Yu et al. | |
| 9,368,460 | B2 | | 6/2016 | Yu et al. | |
| 9,372,206 | B2 | | 6/2016 | Wu et al. | |
| 9,496,189 | B2 | | 11/2016 | Yu et al. | |

(Continued)

*Primary Examiner* — Mahdi H Nejad
(74) *Attorney, Agent, or Firm* — JCIPRNET

(57) ABSTRACT

A workpiece holding mechanism, a process system and a manufacturing method of a semiconductor structure are provided. The workpiece holding mechanism is used in a vacuum chamber, and includes a stage, a platen and a workpiece clamper. The platen is disposed over the stage, and configured to support a workpiece. The workpiece clamper is standing on the stage, and configured to clamp the workpiece from above the workpiece. The workpiece clamper includes a plurality of supporting elements and an elevated structure. The supporting elements are connected between the stage and the elevated structure. The platen is surrounded by the supporting elements. The elevated structure is configured to physically contact a peripheral region of the workpiece from above the workpiece.

20 Claims, 18 Drawing Sheets

(56) References Cited

U.S. PATENT DOCUMENTS

| | | | |
|---|---|---|---|
| 2004/0060513 A1* | 4/2004 | Kojima | H01L 21/6835 118/715 |
| 2004/0094095 A1* | 5/2004 | Huang | H01L 21/68721 118/728 |
| 2021/0005493 A1* | 1/2021 | Fujisato | H01L 21/683 |

* cited by examiner

WORKPIECE HOLDING MECHANISM, PROCESS SYSTEM AND MANUFACTURING METHOD OF SEMICONDUCTOR STRUCTURE

BACKGROUND

In recent years, the semiconductor industry has experienced rapid growth due to continuous improvement in integration density of various electronic components. For the most part, this improvement in integration density has come from reductions in minimum feature size of the integrated circuits (ICs), which allows more of smaller components to be integrated into a given area.

In addition to scaling of the ICS, several advanced packaging techniques are developed for promising greater chip connectivity, lower power consumption or so forth. However, during these advanced packaging processes, warpage of package structures has become a serious problem that could lead to decrease in manufacturing yield and reliability of the packaged electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
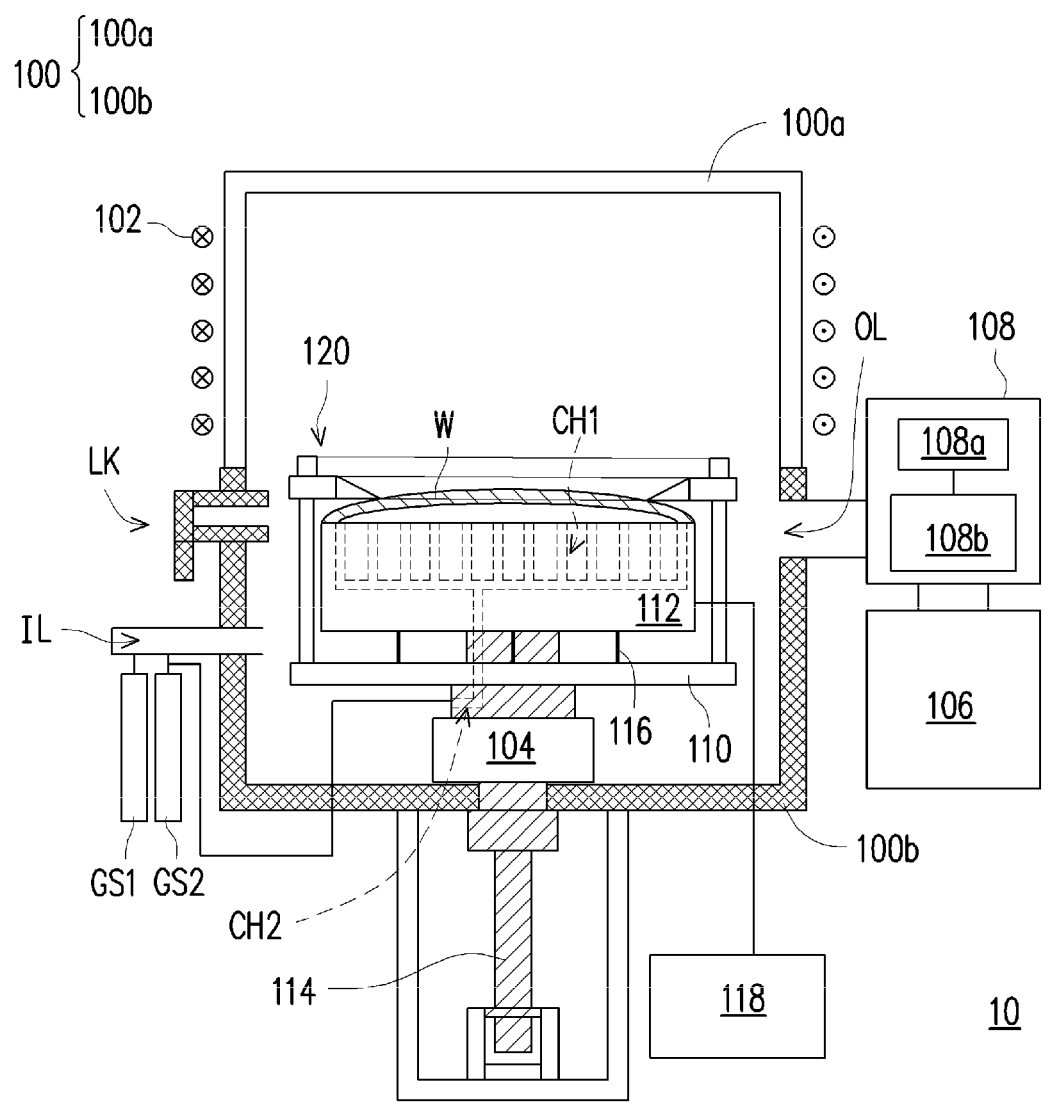
FIG. 1 is a schematic diagram illustrating a process system for manufacturing semiconductor structures, in accordance with some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

FIG. 1 is a schematic diagram illustrating a process system 10 for manufacturing semiconductor structures, in accordance with some embodiments of the present disclosure.

Referring to FIG. 1, in some embodiments, the process system 10 is an etching system for performing a dry etching process. The dry etching process may be performed for forming vias and/or trenches in a polymer layer (e.g., a polymer layer in a redistribution structure) over a reconstructed wafer structure, which includes at least one semiconductor die and an encapsulant laterally encapsulating the semiconductor die(s). In other words, the dry etching process may be performed during a back end section (or referred as an assembly and test section) of a manufacturing process of a semiconductor structure, and the back end section follows a front end section that includes a back end of line (BEOL) portion and a front end of line (FEOL) portion. Alternatively, the dry etching process may be performed in the front end section (e.g., the BEOL portion of the front end section) for forming vias and/or trenches in a dielectric layer of a semiconductor die (e.g., a dielectric layer in an interconnection structure of a semiconductor die). Furthermore, in some embodiments, the process system 10 may be operated to perform a pre-cleaning process, for removing native oxides, impurities etc. on a workpiece before performing a deposition process on this workpiece.

In some embodiments, the process system 10 includes a chamber 100, such as a vacuum chamber. In some embodiments, the chamber 100 has a top portion 100a and a bottom portion 100b. The top portion 100a may be a dielectric cover structure (e.g., a quartz cover), whereas the bottom portion 100b may be a metal housing of which an inner wall may be coated with an insulating material (not shown). For instance, the bottom portion 100b may include Al or stainless steel, and the insulating coating may include aluminum oxide, yttrium oxide or the like. A plasma source 102 may be disposed at an outer wall of the top portion 100a, and configured to provide energy for ionizing atoms of working gas, so as to generate plasma in the top portion 100a. On the other hand, an electrode 104 may be disposed in the chamber 100 (e.g., in the bottom portion 100b of the chamber 100), and configured to drive the ions for performing a dry etching process or a pre-cleaning process. For instance, the plasma source 102 may be an inductively coupled plasma (ICP) source, and include a coil winding around the top portion 100a of the chamber 100. In addition, the plasma source 102 may be provided with radio-frequency (RF) current. In some embodiments, the working gas is provided into the chamber 100 through a gas inlet IL, and may be pumped out through a gas outlet OL by a pump 106. For instance, the working gas is supplied by one or more gas source(s) GS1 connected to the gas inlet IL. The working gas may include $O_2$, Ar, N2, CF4, SF6 the like or combinations thereof. In some embodiments, an automatic pressure control (APC) module 108 is connected between the gas outlet OL and the pump 106, and configured to precisely and dynamically control the pressure in the chamber 100. For instance, the APC module 108 may include a pressure gauge 108a and a pendulum valve 108b connected to the pressure gauge 108a. The pressure gauge 108a is configured to detect the pressure inside the chamber 100, and the pendulum valve 108b is configured to be dynamically controlled according to a comparison result of the detected pressure value and a pre-determined pressure value, so as to dynamically adjust a flow rate (or referred as a pumping rate) of the pump 106. In this way, the pressure in the chamber 100 during a dry etching process (or a pre-cleaning process) can be more stable, and dry etching process (or the pre-cleaning process) can be better controlled. In some embodiments, a load lock LK is coupled to the chamber 100 (e.g., to the bottom portion 100b of the chamber 100) for loading a workpiece W into the chamber 100 or unloading the workpiece W from the chamber 100.

In some embodiments, the process system 10 further includes a stage 110 and a platen 112 disposed over the stage 110. The stage 110 and the platen 112 are located in the chamber 100. For instance, the stage 110 and the platen 112 may be located in the bottom portion 100b of the chamber 100. The platen 112 is configured to support the workpiece W that is subjected to a dry etching process or a pre-cleaning process in the process system 10. In some embodiments, the platen 112 is not configured to grip the workpiece W by applying, for example, an electrostatic force or a force induced by pressure difference. Instead, the platen 112 may simply sustain the workpiece W. Alternatively, the platen 112 may be configured to grip the workpiece W, and may be an electrostatic chuck, a vacuum chuck or the like. In some embodiments, the workpiece W may include a carrier substrate and a reconstructed wafer structure located over the carrier substrate, and the reconstructed wafer structure may include at least one semiconductor die and an encapsulant laterally encapsulating the semiconductor die(s). Alternatively, the workpiece W may be a semiconductor wafer with/without electronic devices formed therein. In certain cases, warpage can be observed on the workpiece W, and may be resulted from process performed on the workpiece W before the workpiece W is transferred into the process system 10. In some embodiments, a platen shaft 114 penetrates through the stage 110 from below the chamber 100 (e.g., below the bottom portion 100b of the chamber 100), and supports the platen 112 from below the platen 112. In these embodiments, the platen 112 can be lifted or lowered with respect to the stage 110 by the platen shaft 114. For instance, the platen shaft 114 may be screwed to lift or lower the platen 112. In those embodiments of which the electrode 104 is disposed in the bottom portion 100b of the chamber 100, the stage 100 and the platen 112 may be disposed over the electrode 104, and the platen shaft 114 may penetrate through the electrode 104 and the stage 110 to reach the platen 112. In addition, in some embodiments, a plurality of lift pins 116 are disposed on the stage 110. When the platen 112 is lifted from the stage 110, at least a portion of each lift pin 116 is connecting between the stage 110 and the platen 112, and a portion of each lift pin 116 may insert into the platen 112. When the platen 112 is lowered to approach the stage 110, each lift pin 116 may penetrate through the platen 112 and lift up the workpiece W, such that the workpiece W can be readily taken away from the platen 112 after the dry etching process or the pre-cleaning process is completed.

In some embodiments, gas channels CH1 are formed in the platen 112. In these embodiments, cooling gas may be provided to a back side of the workpiece W (e.g., a bottom side of the workpiece W as shown in FIG. 1) through the gas channels CH1 in the platen 112, so as to cool down the workpiece W during a dry etching process (or during a pre-cleaning process). For instance, temperature of the workpiece W during a dry etching process in the process system 10 may be kept as less than 85° C. In this way, damages caused by the heat generated during the dry etching process (e.g., warpage) can be minimized. In some embodiments, the cooling gas is supplied by one or more gas source(s) GS2 connected to the gas inlet IL. The cooling gas may flow to the platen 112 via the gas inlet IL, and/or flow to platen 112 through a gas channel CH2 in the platen shaft 114, which is communicated with the gas channels CH1 in the platen 112. For instance, the cooling gas may include He, Ar, the like or combinations thereof.

In some embodiments, the process system 10 further includes a cooling system 118 (e.g., a liquid cooling system), which is configured to remove heat from the platen 112. In these embodiments, the cooling system 118 may include a heat exchanger (not shown), and cooling medium (e.g., cooling liquid) may be provided to a cooling channel in the platen 112 (not shown) by the cooling system 118. Furthermore, a temperature sensor (not shown) may be disposed in the chamber 100 for detecting temperature variation of the workpiece W and/or the platen 112, and the cooling system 118 may adjust temperature of the cooling medium provided to the platen 112 according to the detection result of the temperature sensor. For instance, the temperature sensor may be a thermocouple (TC), a resistive temperature detector (RTD), an infrared (IR) sensor or the like, and may be disposed in the platen 112 or around the platen 112.

Figure 2A:
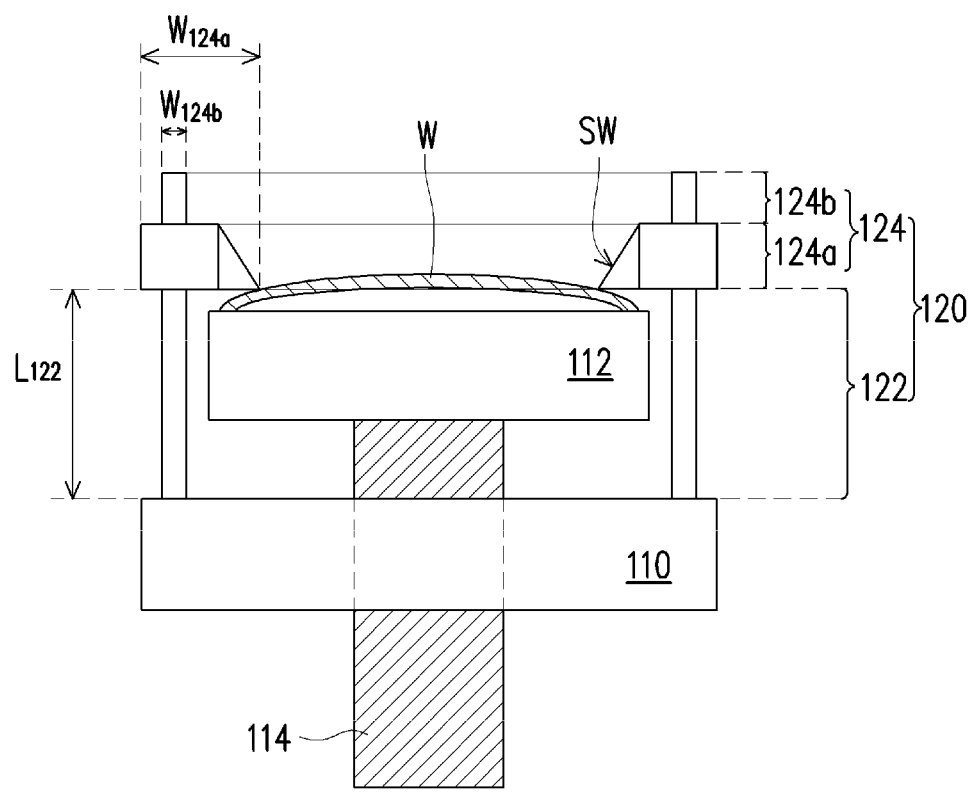
FIG. 2A is an enlarged cross-sectional view illustrating the stage, the platen and the workpiece clamper according to some embodiments of the present disclosure.
Figure 2B:
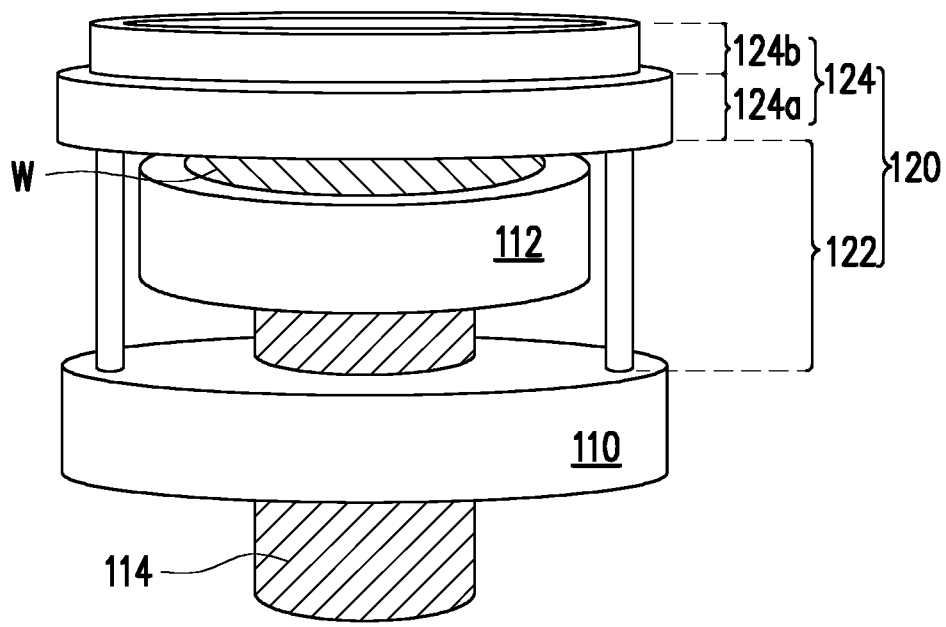
FIG. 2B is a three-dimensional view of the stage, the platen and the workpiece clamper shown in FIG. 2A.
Figure 2C:
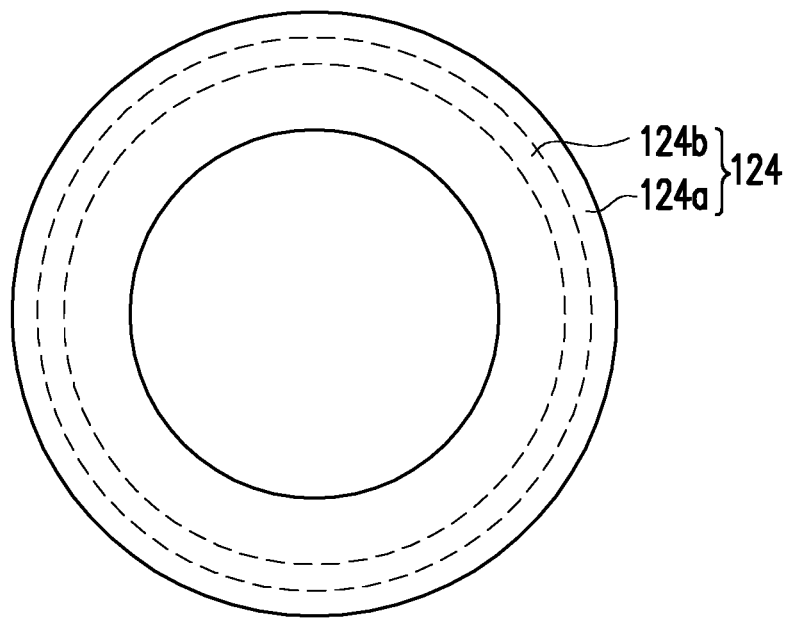
FIG. 2C is a top view of the workpiece clamper shown in FIG. 2A.

FIG. 2A is an enlarged cross-sectional view illustrating the stage 110, the platen 112 and a workpiece clamper 120 according to some embodiments of the present disclosure. FIG. 2B is a three-dimensional view of the stage 110, the platen 112 and the workpiece clamper 120 shown in FIG. 2A. FIG. 2C is a top view of the workpiece clamper 120 shown in FIG. 2A. It should be noted that, for conciseness, some components including the gas channels CH1, CH2 and the lift pins 116 are omitted in FIGS. 2A-2C.

Referring to FIG. 1 and FIGS. 2A-2C, in some embodiments, the process system 10 further includes a workpiece clamper 120. The workpiece clamper 120 is disposed on the stage 110, and configured to clamp the workpiece W on the platen 112 from above the workpiece W. In some embodiments, the clamper 120 may be made of metal, such as steel, Al or the like, and may be coated with an insulating material (e.g., aluminum oxide, yttrium oxide or the like). The stage 110, the platen 112 and the workpiece clamper 120 may be collectively referred as a workpiece holding mechanism. By disposing the workpiece clamper 120, the workpiece W can be firmly fixed on the platen 112, even if the workpiece W has been warped before being transferred into the process system 10. As such, further warpage of the workpiece W resulted from the dry etching process (or pre-cleaning process) performed in the process system 10 can be reduced. In some embodiments, the workpiece clamper 120 includes a plurality of supporting elements 122 and an elevated structure 124 supported by the supporting elements 122 from below the elevated structure 124. The supporting elements 122 stand on the stage 100, and surrounds the platen 112. The elevated structure 124 is partially overlapped with a peripheral region of the platen 112, and configured to physically contact the workpiece W placed on the platen 112. A height of the elevated structure 124 may be fixed, and is defined by a length $L_{122}$ of the supporting elements 122 (as shown in FIG. 2A) measured from a top surface of the stage 110 to top surfaces of the supporting elements 122. For instance, the length $L_{122}$ may range from 30 cm to 60 cm. When the workpiece W is as-transferred onto the platen 112, the platen 112 may be relatively close to the stage 110, and workpiece W is separated from the elevated structure 124 along a vertical direction. Afterwards, the platen 112 may be lifted up by the platen shaft 114, and the workpiece W on the platen 112 can be in physical contact with the elevated structure 124. In this way, the workpiece W can be fixed on the platen 112. Alternatively, the height of the elevated structure 124 is adjustable. When the workpiece W is placed on the platen 112, the elevated structure 124 is lowered down to be in physical contact with the workpiece W, so as to clamp the workpiece W on the platen 112.

In some embodiments, the elevated structure 124 is formed in a ring shape. The ring-shaped elevated structure 124 may have a bottom portion 124a and a top portion 124b. An inner edge region of the bottom portion 124a shields a peripheral region of the platen 112 (as shown in FIG. 2A), and is configured to physically contact the workpiece W placed on the platen 112. In some embodiments, the inner edge region of the bottom portion 124a has an inclined sidewall SW obliquely facing away from a top surface of the platen 112, and is tapered toward an inner boundary of the bottom portion 124a. For instance, an angle between an extending direction of the inclined sidewall SW and a normal direction of a top surface of the platen 112 may range from 45° to 75°. By the taper design of the bottom portion 124a, fewer ions would be blocked by the bottom portion 124a of the elevated structure 124 from obliquely striking the workpiece W, and a larger area of the workpiece W subjected to the dry etching process (or the pre-cleaning process) may be promised. In these embodiments, a thickness of the inner edge region of the bottom portion 124a may gradually decrease toward the inner boundary of the bottom portion 124a, and the bottom portion 124a of the elevated structure 124 may have a sharp inner edge. On the other hand, the top portion 124b and the remainder region of the bottom portion 124a may be located outside the span of the platen 112, and may have a substantially constant thickness. In some embodiments, as shown in FIG. 2A, a width $W_{124b}$ of the top portion 124b is less than a width $W_{124a}$ of the bottom portion 124a. For instance, a ratio of the width $W_{124b}$ with respect to the width $W_{124a}$ may range from 1:4 to 1:8. As similar to the effect of the inclined sidewall SW of the bottom portion 124a, fewer ions would be blocked by the top portion 124b from obliquely striking the workpiece W if the top portion 124b is formed with a width less than a width of the bottom portion 124a.

Figure 3A:
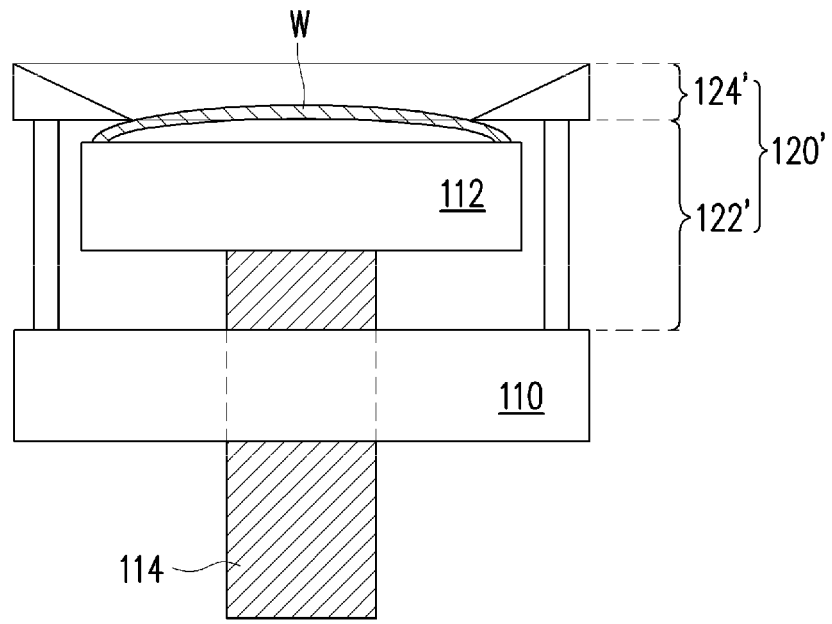
FIG. 3A and FIG. 3B are cross-sectional views illustrating the stage, the platen and the workpiece clamper according to some alternative embodiments of the present disclosure.
Figure 3B:
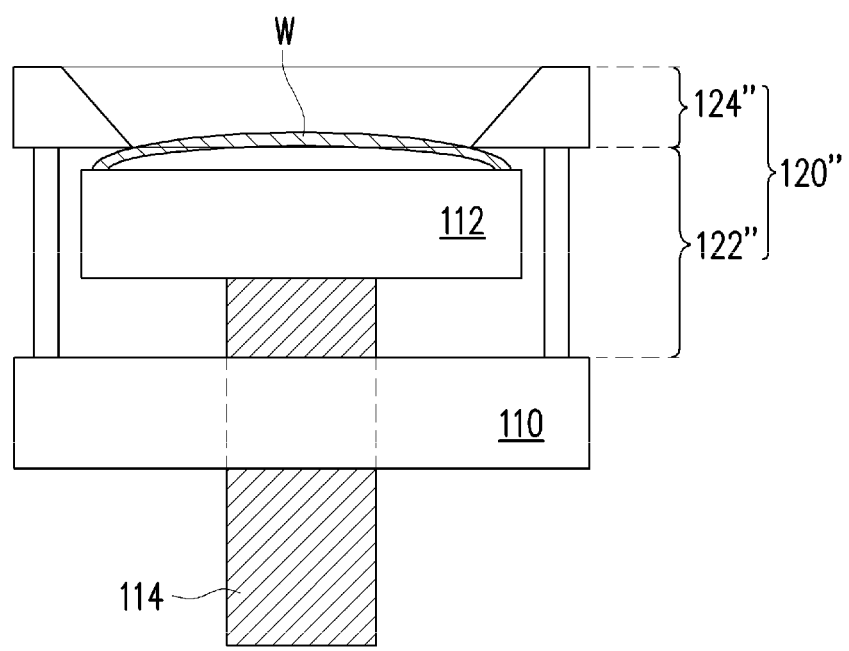

FIG. 3A and FIG. 3B are cross-sectional views respectively illustrating the stage 110, the platen 112 and a workpiece clamper 120'/120" according to some alternative embodiments of the present disclosure. The workpiece clampers 120' and 120" as shown in FIG. 3A and FIG. 3B are similar to the workpiece clamper 120 as shown in FIG. 1 and FIGS. 2A-2C. Only the difference therebetween will be described, the like or the same parts will not be repeated again.

Referring to FIG. 3A, an elevated structure 124' of the workpiece clamper 120' is formed as a ring structure having a thickness gradually decreasing from an outer edge of the elevated structure 124' to an inner edge of the elevated structure 124'. In these alternative embodiments, the elevated structure 124' may have a substantially triangular cross-section.

Referring to FIG. 3B, an elevated structure 124" of the workpiece clamper 120" is formed as a ring structure having an inner edge region with a thickness decreasing toward an inner edge of the elevated structure 124". On the other hand, the remainder region of the elevated structure 124" may have a substantially constant thickness, and thus have a substantially flat top surface. In these alternative embodiments, the elevated structure 124" may have a substantially trapezoidal cross-section.

However, those skilled in the art may adjust the appearance of the elevated structure 124 according to process requirements, as long as the elevated structure 124 can clamp the workpiece W from above the workpiece W. The present disclosure is not limited to the appearance of the elevated structure 124.

Figure 4:
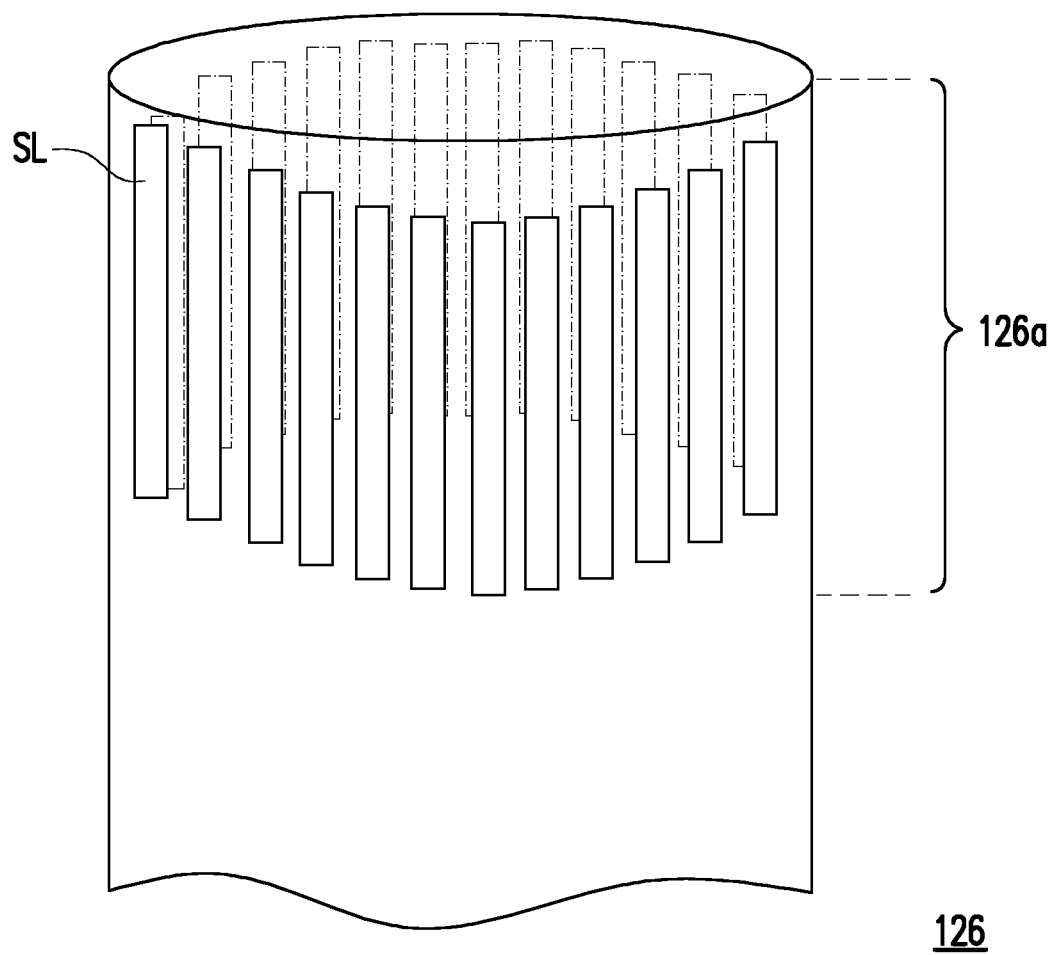
FIG. 4 is a three-dimensional view of a shielding wall in a chamber of a process system according to some embodiments of the present disclosure.

FIG. 4 is a three-dimensional view of a shielding wall 126 in the chamber 100 of a process system 10 according to some embodiments of the present disclosure.

Referring to FIG. 1 and FIG. 4, in some embodiments, the process system 10 further includes a shielding wall 126 (as shown in FIG. 4) covering an inner wall of the chamber 100 (as shown in FIG. 1). Components located in the chamber 100 (e.g., the stage 110, the platen 112, the workpiece clamper 120 etc.) are surrounded by the shielding wall 126. In some embodiments, the shielding wall 126 spreads in the top portion 100a and the bottom portion 100b of the chamber 100, and appears in a columnar shape. An upper section 126a of the shielding wall 126 covering an inner wall of the top portion 100a has a plurality of slits SL. The slits SL are arranged along an annular extending direction of the upper section 126a, and are laterally separated from one another. As such, the upper section 126a of the shielding wall 126 appears as a grating structure. A body portion of the upper section 126a can block the etched materials from re-depositing onto the inner wall of the chamber 100. Even though the etched materials may deposit onto the inner wall of the chamber 100 through the slits SL, the re-deposited material may not form a continuous film, thus allow passage of the magnetic field for generating plasma in the top portion 100a of the chamber 100. On the other hand, the remainder section (or referred as a lower section) 126b of the shielding wall 126 may be free of the slits SL, and can be functioned as a protection wall of the bottom portion 100b of the chamber 100. In some embodiments, the shielding wall 126 is made of metal, such as steel, Al, the like or combinations thereof.

Figure 5:
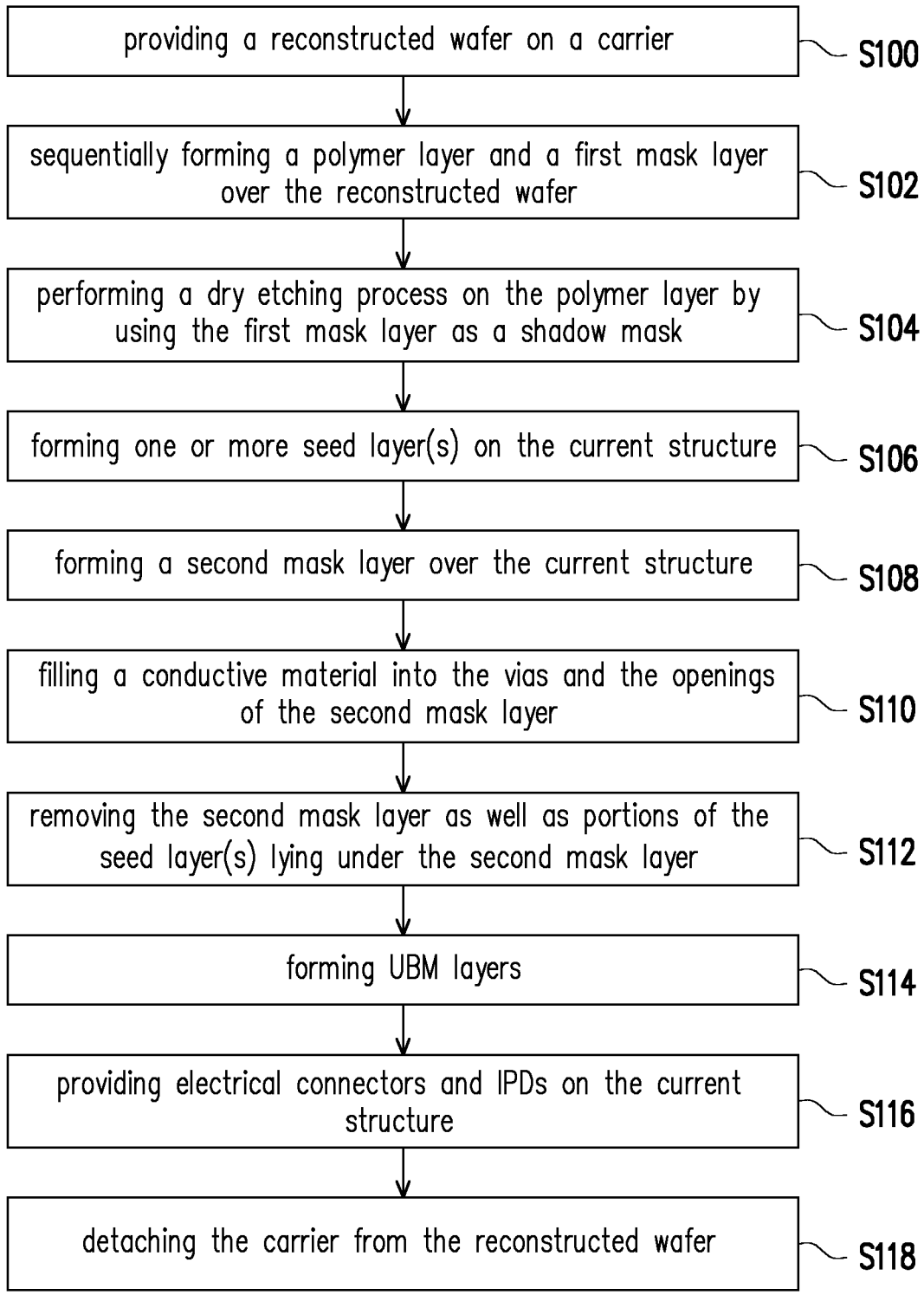
FIG. 5 is a process flow diagram illustrating a manufacturing method of a semiconductor structure according to some embodiments of the present disclosure.

FIG. 5 is a process flow diagram illustrating a manufacturing method of a semiconductor structure 20 according to some embodiments of the present disclosure. FIGS. 6A-6K are cross-sectional views illustrating structures at various stages during the manufacturing process of the semiconductor structure 20 as shown in FIG. 5. The manufacturing method of the semiconductor structure 20 includes using the process system 10 illustrated with reference to FIG. 1, FIGS. 2A-2C, FIGS. 3A-3B and FIG. 4, and includes the following steps.

Figure 6A:
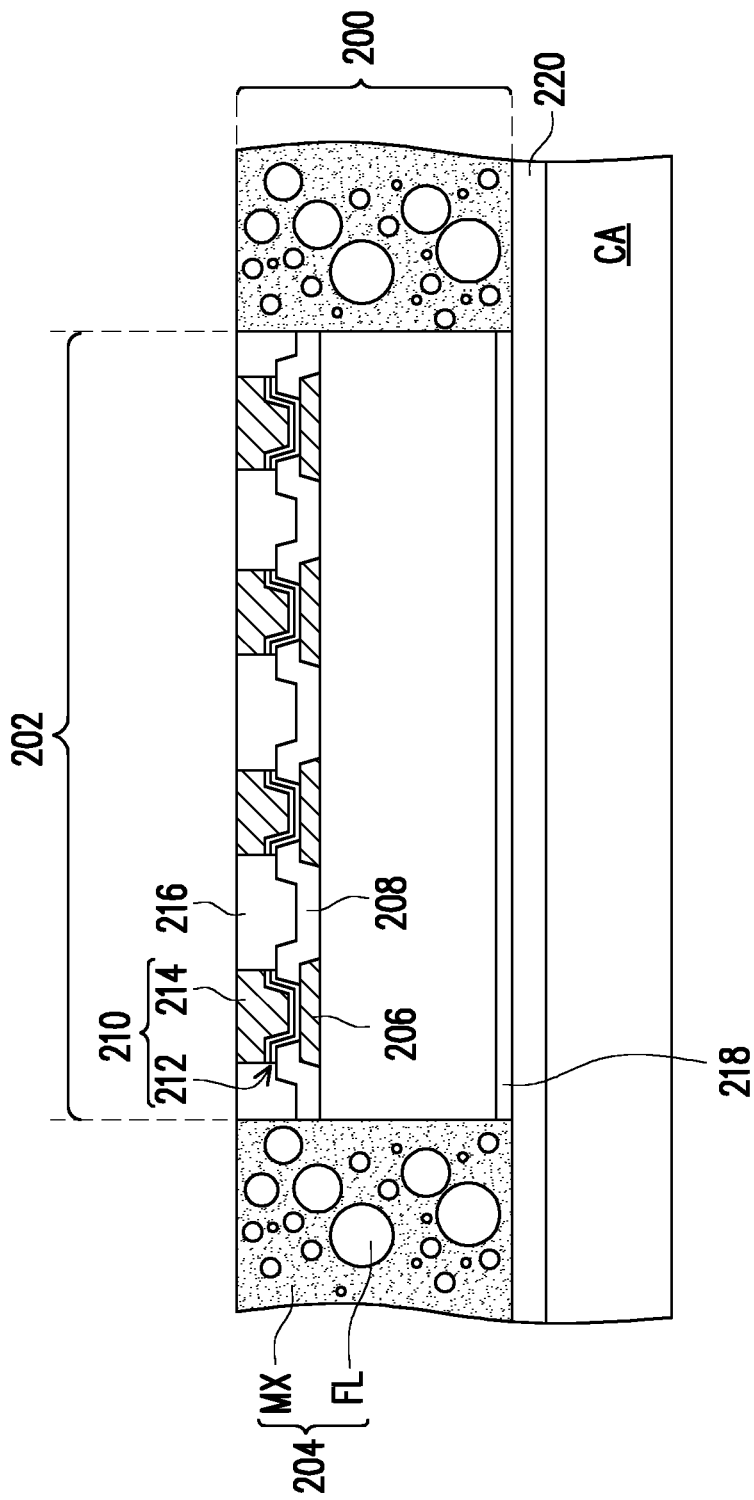
FIGS. 6A-6K are cross-sectional views illustrating structures at various stages during the manufacturing process of the semiconductor structure as shown in FIG. 5.

Referring to FIG. 5 and FIG. 6A, step S100 is performed, and a reconstructed wafer 200 is provided on a carrier CA. In some embodiments, the reconstructed wafer 200 includes a plurality of semiconductor dies 202 (only one of the semiconductor dies 202 is shown in FIG. 6A) and an encapsulant 204 laterally encapsulating these semiconductor dies 202. The encapsulant 204 may include a base material MX and a plurality of fillers FL spreading in the base material MX. The semiconductor die 202 may include a plurality of conductive pads 206 formed at an active side of the semiconductor die 202. A passivation layer 208 formed on the conductive pads 206 has openings at least partially overlapped with the conductive pads 206. A plurality of conductive pillars 210 formed on the passivation layer 208 extend through these openings, and are in electrical contact with the conductive pads 206. The conductive pillars 210 may respectively include one or more seed layers 212 and a conductive material 214 formed thereon. For instance, each conductive pillar 210 may have two seed layers 212 including, for example, a titanium layer and a copper layer, whereas the conductive material 214 may be formed of copper. In some embodiments, a polymer layer 216 is formed on the passivation layer 208, and laterally surrounds the conductive pillars 210. In addition, in some embodiments, top surfaces of the encapsulant 204, the conductive pillars 210 and the polymer layer 216 are substantially coplanar with each other. On the other side, a die attach film 218 may be provided at a back side of the semiconductor die 202, and a bottom surface of the encapsulant 204 may be substantially coplanar with a bottom surface of the die attach film 218. Moreover, an adhesive layer 220 may be disposed between the carrier CA and the reconstructed wafer 200. For instance, the adhesive layer 220 may be a release layer, such as a thermal release layer or a light-to-heat-conversion (LTHC) release layer.

Figure 6B:
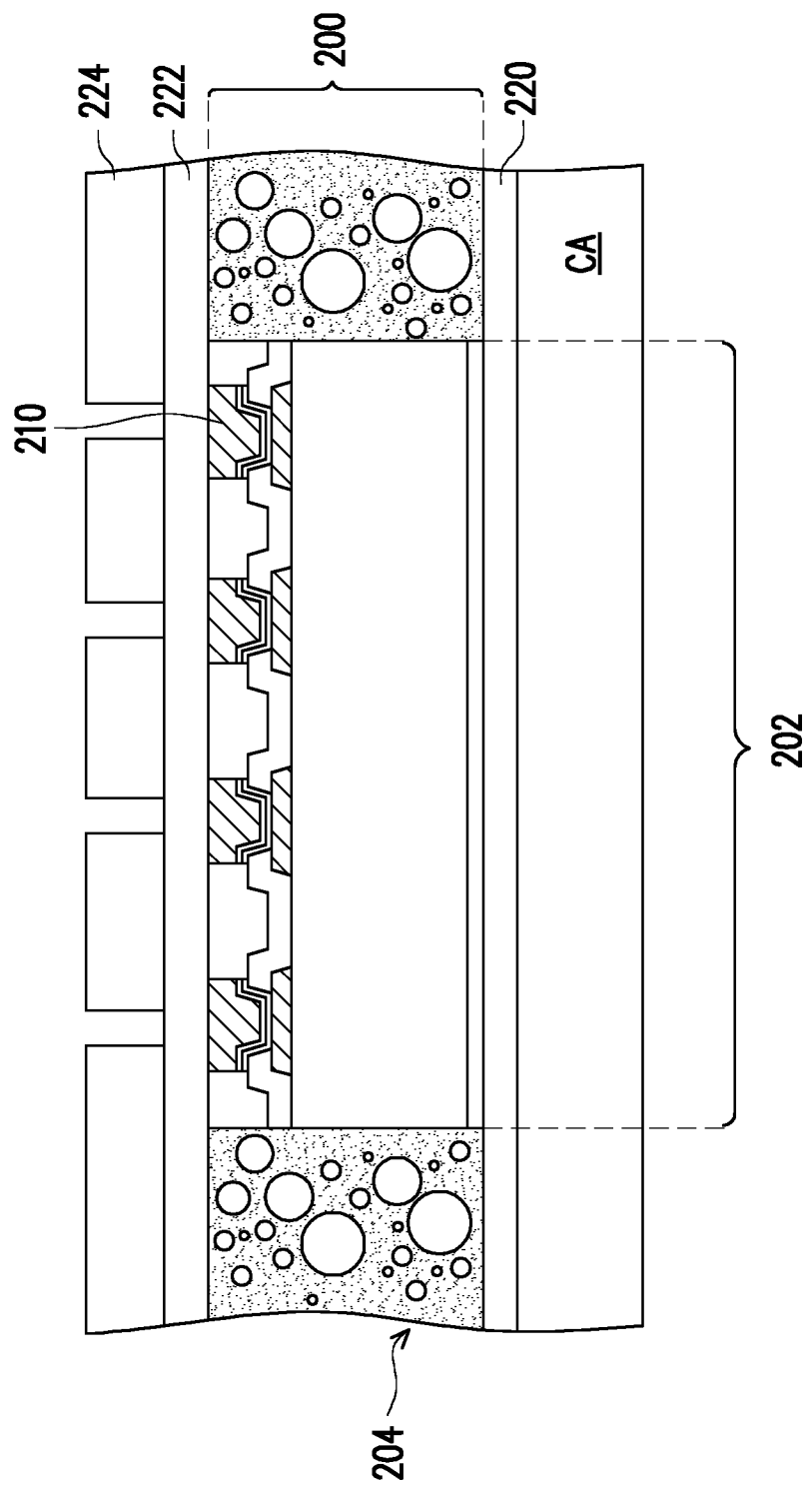
Figure 6C:
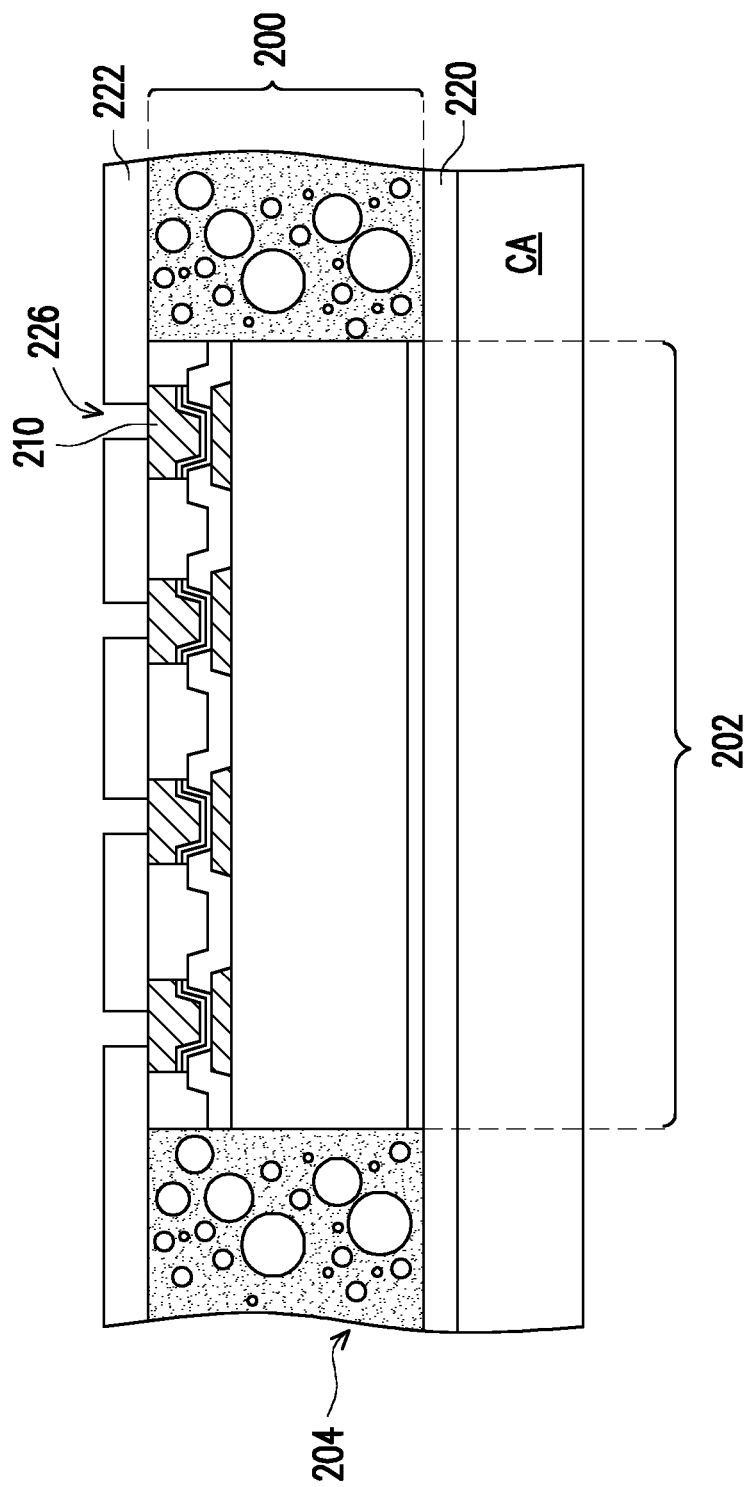

Referring to FIG. 5 and FIG. 6B, step S102 is performed, such that a polymer layer 222 and a mask layer 224 are sequentially formed over the reconstructed wafer 200. The polymer layer 222 may globally cover the reconstructed wafer 200, and is a portion of a redistribution structure to be completely formed in the following steps (i.e., the redistribution structure 234 as shown in FIG. 6H). In some embodiments, the polymer layer 222 is made of a photo-insensitive material (e.g., photo-insensitive polyimide), and formed by a solution process (e.g., a spin coating process). In these embodiments, the polymer layer 222 cannot be patterned simply by an exposure process and a development process. Instead, the mask layer 224 formed on the polymer layer 222 can be used as a shadow mask during a dry etching process to be performed for patterning the polymer layer 222 (as shown in FIG. 6C), such that a pattern of the mask layer 224 can be transferred to the polymer layer 222. In some embodiments, the mask layer 224 is a photoresist layer, and has openings for defining vias to be formed in the polymer layer 222 in the following step (as shown in FIG. 6C). These openings may be formed by performing an exposure process and a development process on the mask layer 224.

Referring to FIG. 1, FIG. 5 and FIG. 6C, step S104 is performed, and a dry etching process is performed on the polymer layer 222 by using the mask layer 224 as a shadow mask. In some embodiments, the structure shown in FIG. 6B is transferred into the process system 10 as shown in FIG. 1 for performing the dry etching process, and can be the workpiece W being clamped on the platen 112 by the workpiece clamper 120 as shown in FIG. 1. During the dry etching process, portions of the polymer layer 222 exposed by the mask layer 224 are removed to form a plurality of vias 226 in the polymer layer 222. The underlying conductive pillars 210 are at least partially exposed by the vias 226. Since the workpiece W (i.e., the structure as shown in FIG. 6B) can be firmly fixed, and the temperature of the workpiece W as well as the pressure in the chamber 100 can be well controlled, the dry etching process can be more stably and more uniformly performed. Thus, the profiles of the vias 226 can be better defined. In some embodiments, the vias 226 respectively have a substantially vertical sidewall. In these embodiments, an extending direction of the sidewall of the via 226 is offset from a vertical direction by an angle less than 5°. In addition, an aspect ratio (i.e., a ratio of a depth with respect to a width) of the via 226 may range from 2 to 10.

After forming the vias 226, the platen 112 may be lowered, and the processed workpiece W can be transferred out of the chamber 100. Subsequently, the mask layer 224 is removed by, for example, a stripping process or an ashing process. As such, a top surface of the polymer layer 222 is exposed.

In alternative embodiments, the polymer layer 222 is made of a photo-sensitive material. In these alternative embodiments, the vias 226 can be formed by performing an exposure process and a development process on the polymer layer 222, and the mask layer 224 is omitted.

Figure 6D:
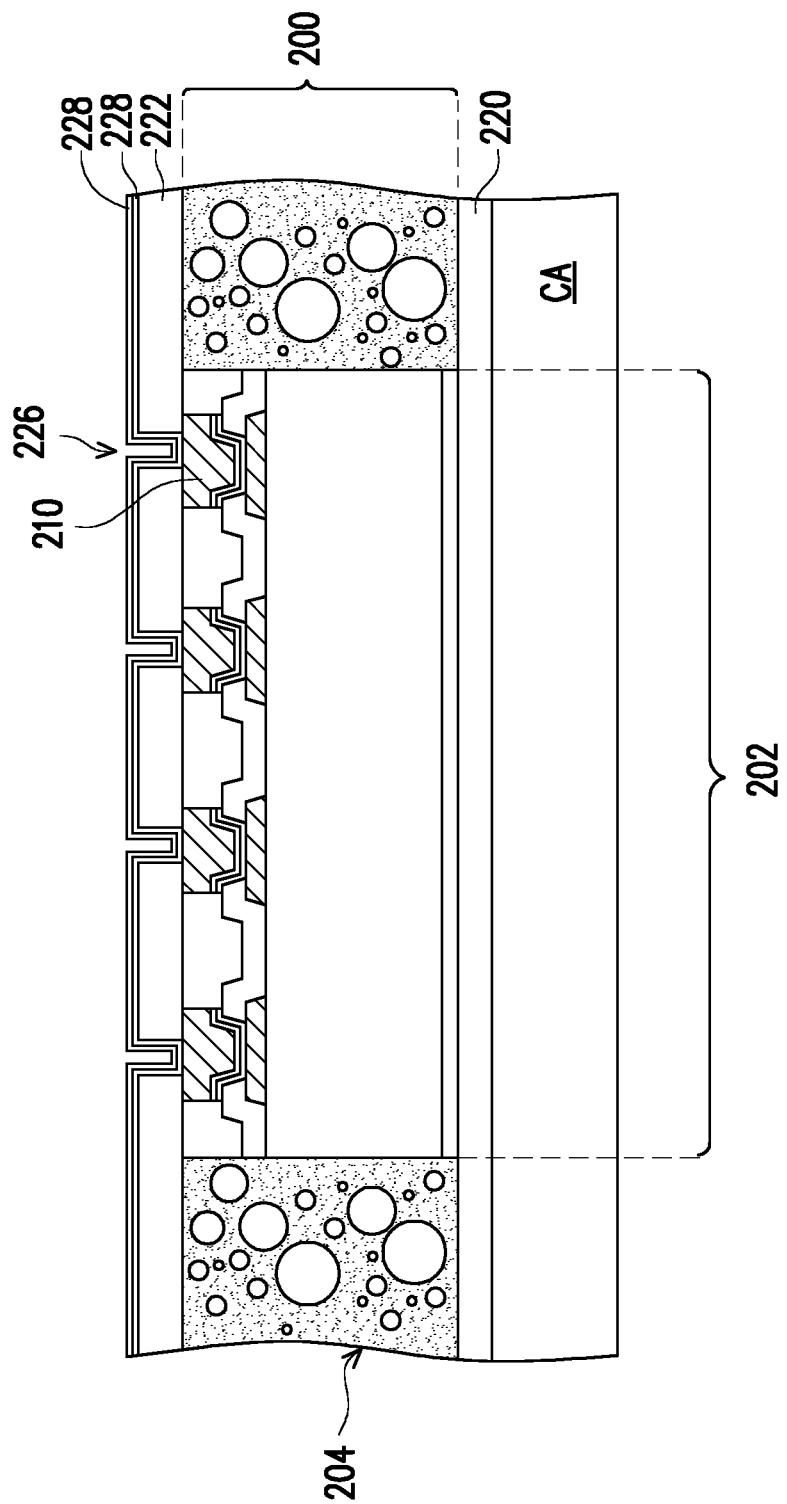

Referring to FIG. 5 and FIG. 6D, step S106 is performed, and one or more seed layer(s) 228 is formed on the current structure (i.e., the structure as shown in FIG. 6C). In some embodiments, the seed layer(s) 228 is/are conformally formed on the current structure. In these embodiments, a top surface of the polymer layer 222, sidewalls of the vias 226 and the previously exposed surfaces of the conductive pillars 210 are covered by the seed layer(s) 228. For instance, two seed layers 228 are formed. A bottom one of the seed layers 228 may be a titanium layer, whereas a top one of the seed layers 228 may be a copper layer. In some embodiments, a formation method of each seed layer 228 includes a physical vapor deposition (PVD) process. In addition, in some embodiments, the structure as shown in FIG. 6C is subjected to a pre-cleaning process before being deposited with the seed layer(s) 228. Such pre-cleaning process may be performed in the process system 10 as shown in FIG. 1.

Figure 6E:
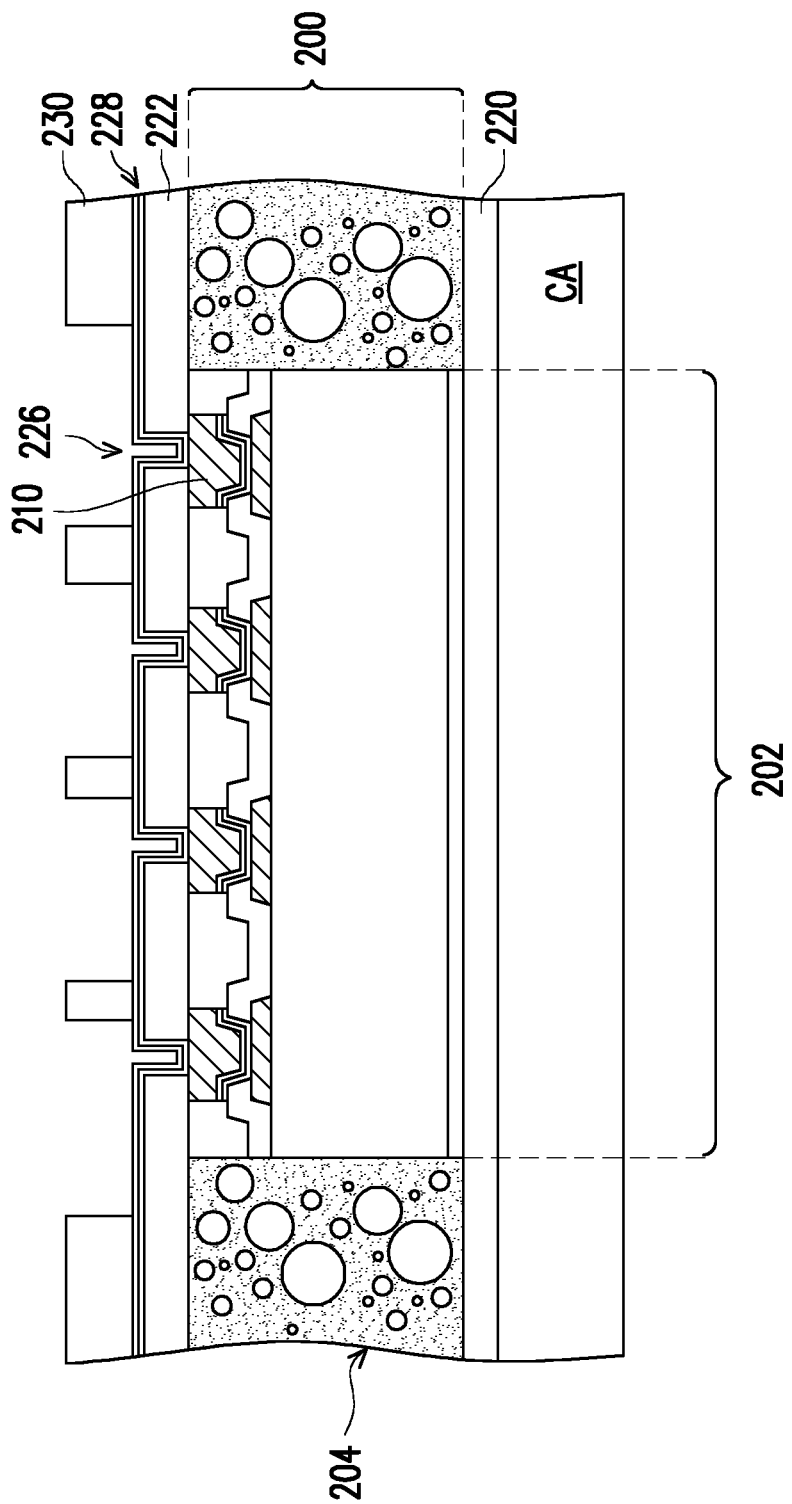
Figure 6F:
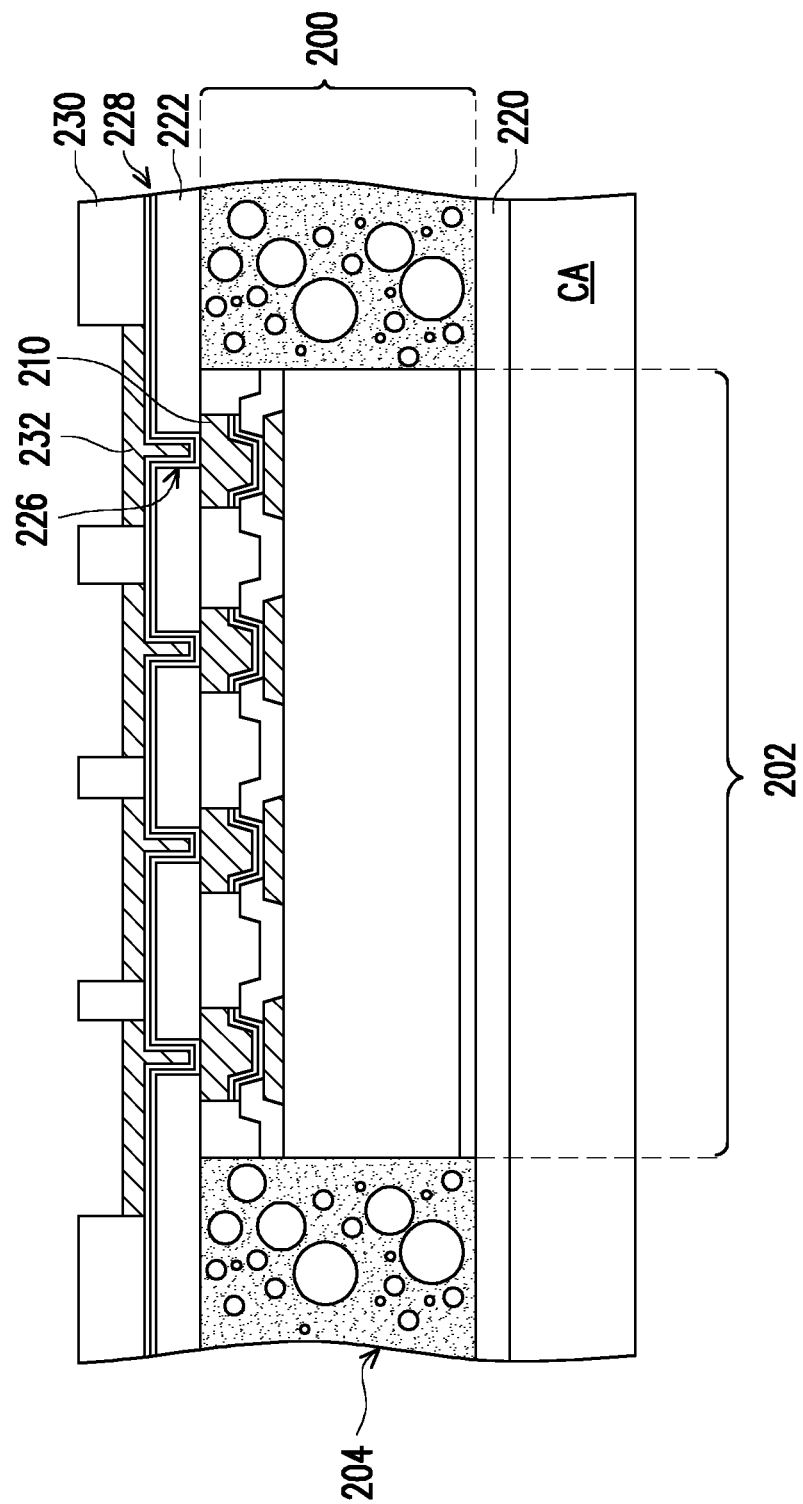

Referring to FIG. 5 and FIG. 6E, step S108 is performed, and a mask layer 230 is formed over the current structure (i.e., the structure shown in FIG. 6D). The mask layer 230 has openings in which a conductive material to be filled in the following step (i.e., the conductive material 232 as shown in FIG. 6F). These openings are respectively communicated with the underlying vias 226, and may be formed as trenches. In some embodiments, the mask layer 230 is made of a photoresist material, and formed by a solution process (e.g., a spin coating process). In addition, the openings may be formed by performing an exposure process and a development process on the photoresist material.

Referring to FIG. 5 and FIG. 6F, step S110 is performed, and a conductive material 232 is filled into the vias 226 and the openings of the mask layer 230. Portions of the conductive material 232 and the seed layer(s) 228 filled in the vias 226 form conductive vias, whereas other portions of the conductive material 232 and the seed layer(s) 228 located in the openings of the mask layer 230 form conductive traces. The conductive vias penetrate through the polymer layer 222, and electrically connect to the underlying conductive pillars 210. The conductive traces laterally extend over the polymer layer 222, and electrically connect to the underlying conductive vias. In some embodiments, the conductive material 232 includes copper. A method for forming the conductive material 232 may include a plating process, such as an electroplating process or an electroless plating process. In some embodiments, a top surface of the conductive material 232 is substantially coplanar with or lower than a top surface of the mask layer 230 by, for example, 1 um to 5 um. In these embodiments, the conductive material 232 would not extend onto the mask layer 230, thus a planarization process (e.g., a chemical mechanical polishing (CMP) process, an etching process, a grinding process or the like) may not be required to remove portions of the conductive material 232 on the mask layer 230.

Figure 6G:
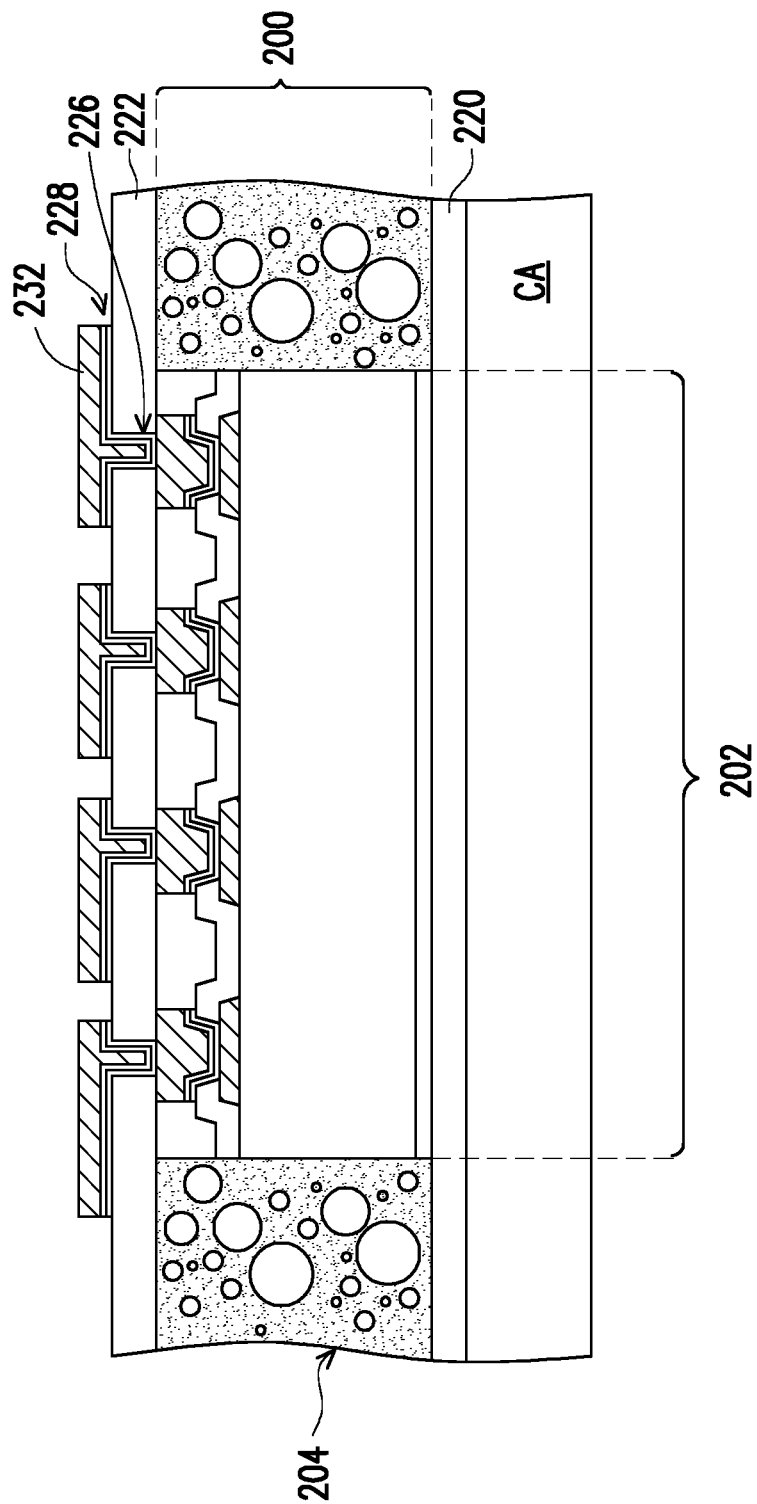
Figure 6H:
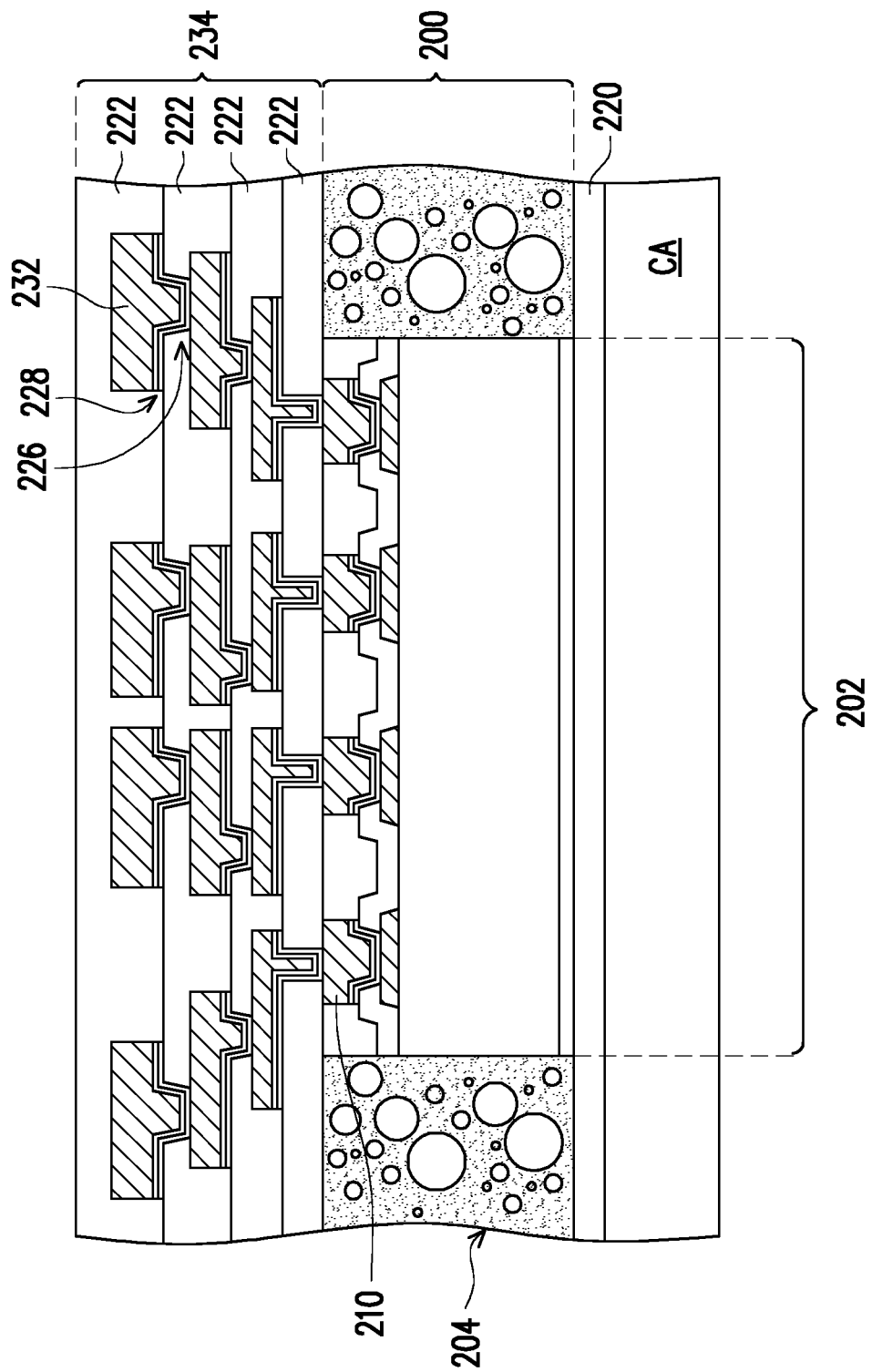

Referring to FIG. 5 and FIG. 6G, step S112 is performed, and the mask layer 230 as well as portions of the seed layer(s) 228 lying under the mask layer 230 are removed. The removal of the mask layer 230 may include a stripping process, an ashing process or the like. In some embodiments, after removing the mask layer 230, the portions of the seed layer(s) 228 used to lie under the mask layer 230 are removed by a dry etching process. In these embodiments, the current structure may be transferred into the process system 10 as being the workpiece W shown in FIG. 1, for subjecting to the dry etching process. During the dry etching process, the portions of the conductive material 232 above the polymer 222 may be functioned as a shadow mask. Portions of the seed layer(s) 228 not being covered by the shadow mask would be removed, whereas other portions of the seed layer(s) 228 being shielded by the shadow mask would remain. In some embodiments, the shadow mask may be partially consumed during the dry etching process, thus a thickness of the conductive material 232 may be reduced along with the removal of the portions of the seed layer(s) 228 aside the conductive material 232. After removal of these portions of the seed layer(s) 228, some portions of the polymer layer 222 are exposed. The process described with reference to FIGS. 6B-6G can be considered as a cycle for forming a polymer layer, conductive vias in the polymer layer and conductive traces over the polymer layer. Subsequently, one or more of the cycle(s) may be performed to form a redistribution structure (i.e., the redistribution structure 234 as shown in FIG. 6H) having multiple levels of the polymer layer 222, the seed layers 228 and the conductive materials 232.

Referring to FIG. 6H, for instance, two more cycles are performed, then one more polymer layer 222 is formed thereon. Up to here, a redistribution structure 234 is formed. The redistribution structure 234 includes a stack of the polymer layers 222, and includes multiple levels of the conductive materials 232 and the seed layers 228 spreading in the stack of polymer layers 222. The conductive materials 232 and the seed layers 228 covered by the conductive materials 232 are formed as conductive traces and conductive vias. The conductive vias respectively penetrate through one or more of the polymer layers 222, whereas the conductive traces respectively extend over one of the polymer layers 222 and electrically connect to one or more of the conductive vias. In some embodiments, as shown in FIG. 6H, the bottommost conductive vias respectively have a substantially vertical sidewall. On the other hand, the remainder conductive vias respectively have an inclined sidewall, and respectively have a width gradually decreasing toward a bottom end of each of these conductive vias. For instance, an extending direction of such inclined sidewall is offset from a vertical direction by an angle ranging from 15° to 30°. In addition, these remainder conductive vias may respectively have an aspect ratio ranging from 0.5 to 2. The conductive traces and the conductive vias can be collectively referred as redistribution elements. The redistribution elements are electrically connected to the semiconductor dies 202 through the conductive pillars 210, and fan out from the ranges of the semiconductor dies 202 to a range of the reconstructed wafer 200, so as to out rout the semiconductor dies 202.

Figure 6I:
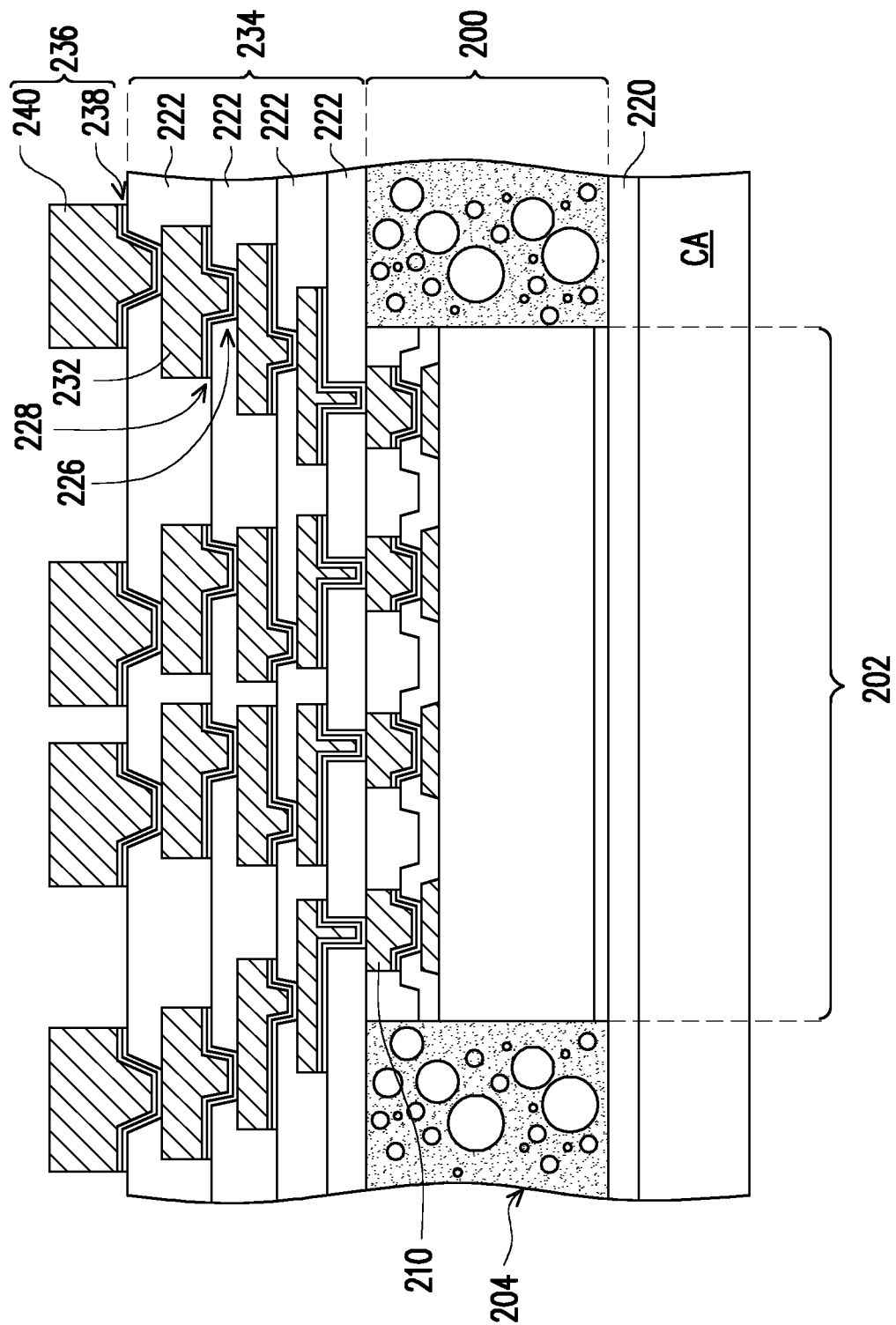

Referring to FIG. 5 and FIG. 6I, step S114 is performed, and under bump metallization (UBM) layers 236 are formed. The UBM layers 236 penetrate through the topmost polymer layer 222 of the redistribution structure 234 from above the topmost polymer layer 222, and electrically connect to the topmost conductive material 232. In some embodiments, the UBM layer 236 includes one or more seed layer(s) 238 and a conductive material 240 formed over the seed layer(s) 238. A method for forming the UBM layers 236 may be similar to the process as described with reference to FIGS. 6B-6G, and will not be repeated again. In some embodiments, two seed layers 238 are formed. For instance, the bottom one of the seed layers 238 is a titanium layer, whereas the top one of the seed layers 238 is a copper layer. In addition, a material of the conductive material 240 may include copper.

Figure 6J:
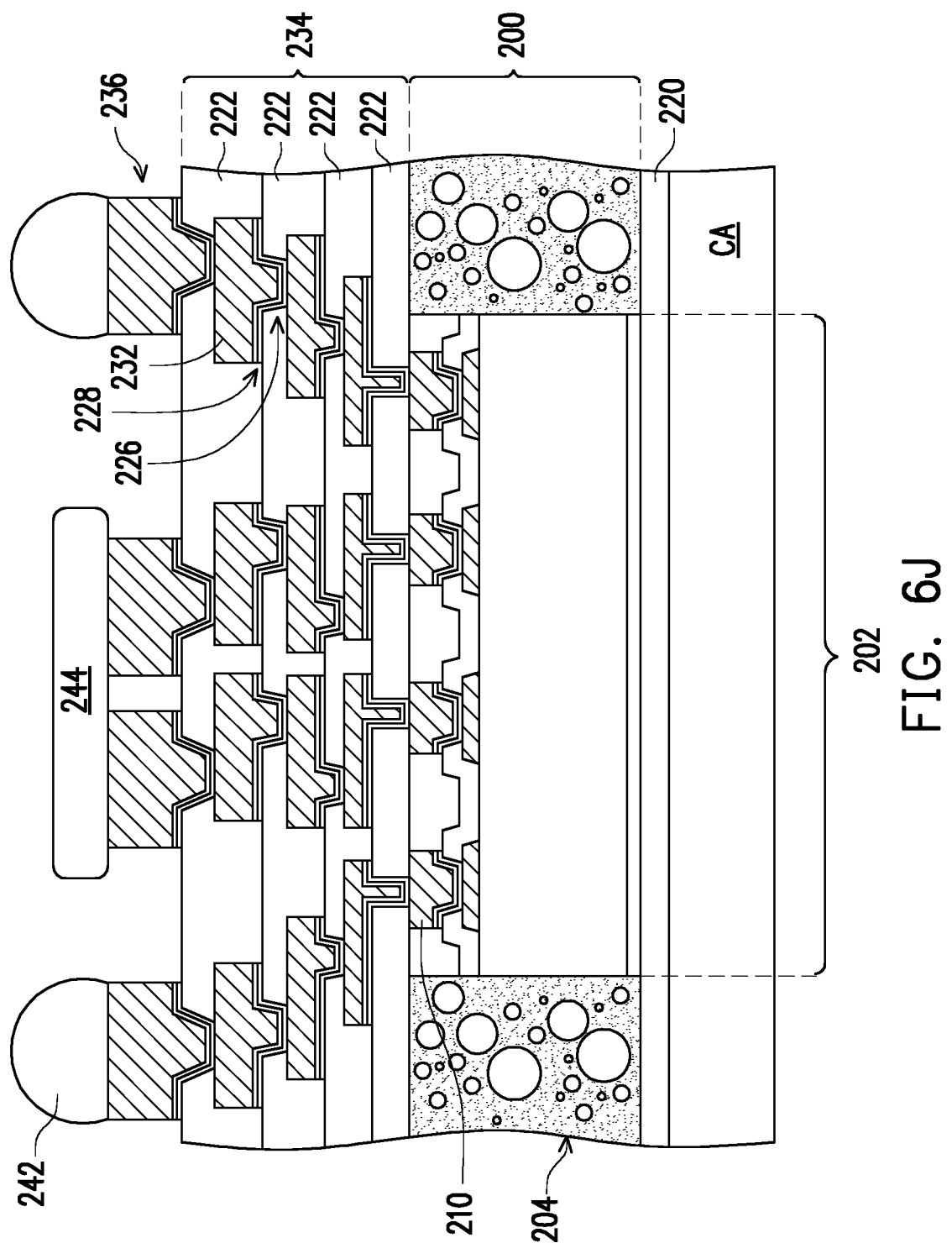

Referring to FIG. 5 and FIG. 6J, step S116 is performed, such that electrical connectors 242 and integrated passive devices (IPDs) 244 are provided on the current structure. The electrical connectors 242 are formed on some of the UBM layers 236, whereas the IPDs 244 (only a single IPD 244 is depicted in FIG. 6J) are attached onto others of the UBM layers 236. In some embodiments, the electrical connectors 242 are respectively formed on one of the UBM layers 236, whereas the IPDs 244 are respectively attached onto one or more of the UBM layers 236 (e.g., two of the UBM layers 236). In some embodiments, the electrical connectors 242 are contact bumps, and may be made of tin, silver, lead-free tin, copper, the like or combinations thereof. For instance, the electrical connectors 242 are tin bumps, and a method for forming the tin bumps includes initially forming tin layers on the UBM layers 236 by using a technique such as evaporation, electroplating, printing, solder transfer, ball placement or the like. Once the tin layers have been formed on the UBM layers 236, a reflow process may be performed on the tin layers to shape the material into a desired bump shape for the electrical connectors 242. Alternatively, the electrical connectors 242 may be solder balls or other suitable types of electrical connectors. On the other hand, the IPDs 244 may be, for example, semiconductor devices or other devices that respectively include one or more passive device(s) (not shown), such as capacitors, resistors, inductors or the like. Furthermore, the IPDs 244 may respectively include metallization layers (not shown) that are electrically connected to the passive device(s) for particular functionality. In some embodiments, the IPDs 244 are attached to some of the UBM layers 236 by, for example, sequentially dipping connectors of the IPDs 244 (e.g., bumps, solder balls) into flux, and then using a pick-and-place tool in order to physically align the connectors of the IPDs 244 with corresponding UBM layers 236. Subsequently, a reflow process may be performed to bond the connectors of the IPDs 244 to the corresponding UBM layers 236. In some embodiments, the IPDs 244 are placed between adjacent electrical connectors 242. In these embodiments, the electrically connectors 242 are formed before the attachment of the IPDs 244. However, in alternative embodiments, the attachment of the IPDs may precede the formation of the electrical connectors 242.

Figure 6K:
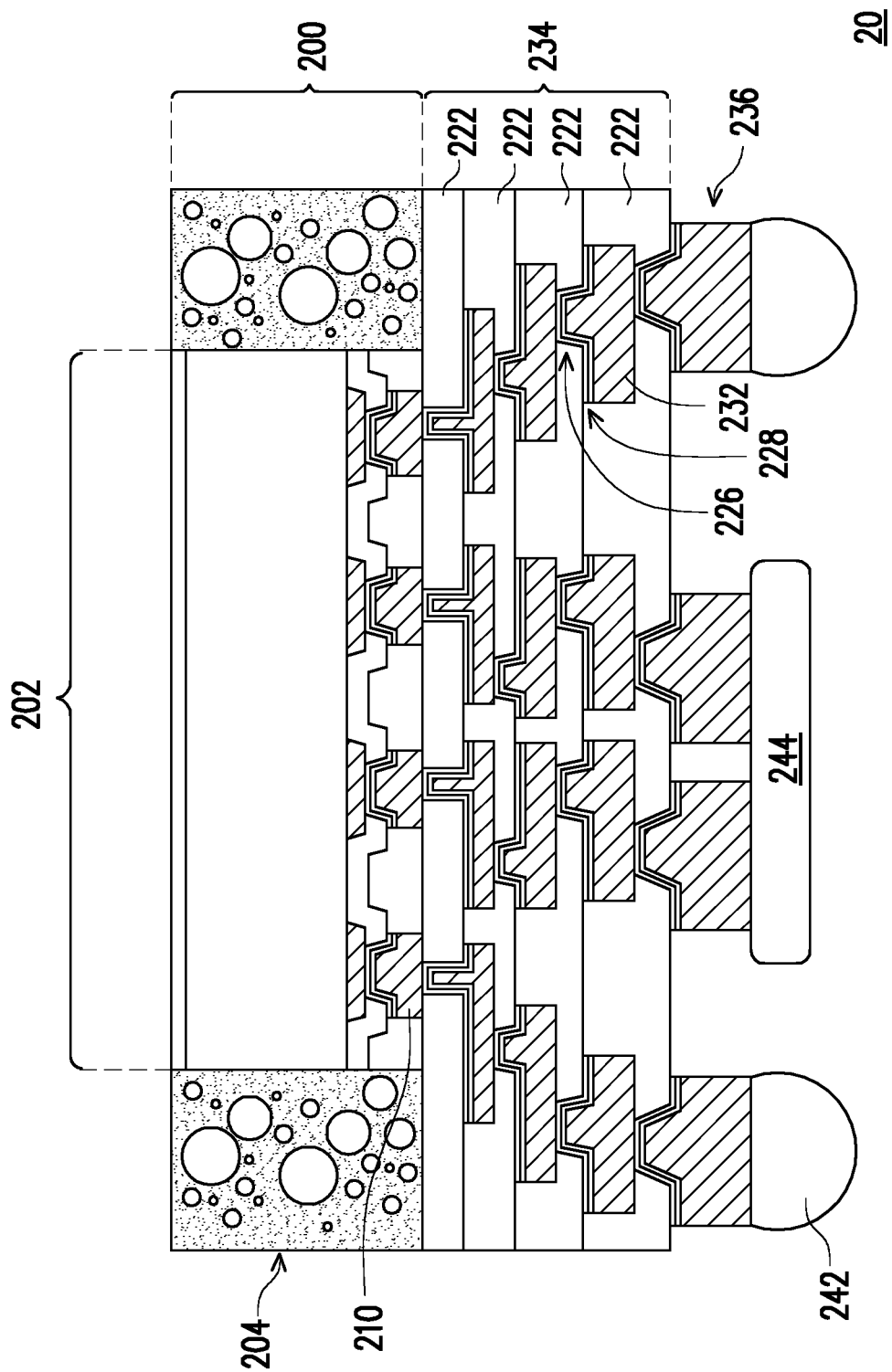

Referring to FIG. 5 and FIG. 6K, step S118 is performed, and the carrier CA is detached from the reconstructed wafer 200. In some embodiments, before detaching the carrier CA, the structure shown in FIG. 6J is flipped over, and the electrical connectors 242 may be attached to a tape or another carrier (not shown). In those embodiments of which the adhesive layer 220 disposed between the carrier CA and the reconstructed wafer 200 is a thermal release layer or a LTHC release layer, the adhesive layer 220 may lose its adhesiveness while being exposed to heat or light, thus the carrier CA may be detached from the reconstructed wafer 200 along with the adhesive layer 220. After removing the carrier CA and the adhesive layer 220, a back side of the encapsulant 204 as well as the die attached films 218 provided at the back sides of the semiconductor dies 202 may be exposed. In some embodiments, the current package structure is subjected to a singulation process, such as a dicing process, a sawing process or a laser ablation process. Each of the singulated package structures may be referred as a semiconductor structure 20. As shown in FIG. 6K, the semiconductor structure 20 contains at least one of the semiconductor dies 202, which is laterally encapsulated by a portion of the encapsulant 204, and out routed to some of the electrical connectors 242 through a portion of the redistribution structure 234 and some of the UBM layers 236. In some embodiments, the semiconductor structure 20 further includes at least one of the IPDs 244 placed between adjacent electrical connectors 242.

Furthermore, in some embodiments, the semiconductor structure 20 is further attached to a package component (not shown) through the electrical connectors 242, so as to form a three dimensional integrated circuit (3DIC). For instance, the package component may be an interposer, a package substrate or another package structure. On the other hand, in some embodiments, a heat dissipation module (not shown) may be attached to a back side of the semiconductor structure 20 that is facing away from the redistribution structure 234, so as to facilitate heat dissipation of the semiconductor die 202. For instance, the heat dissipation module may be formed of metal or other thermal conductive materials, and the heat dissipation module may be attached to the semiconductor structure 20 through a thermal interfacial material (TIM).

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 7:
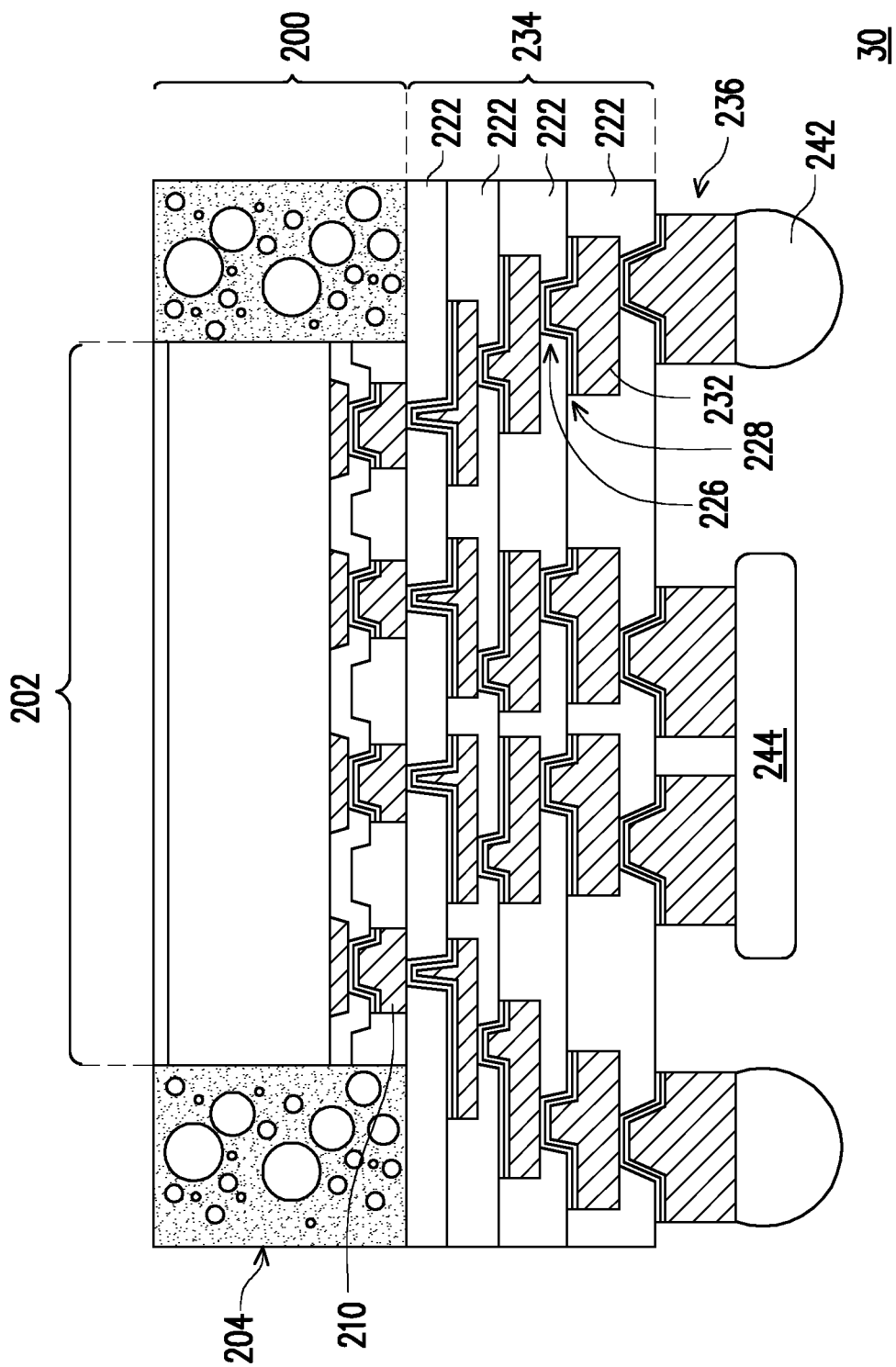
FIG. 7 is a cross-sectional view illustrating a semiconductor structure according to some alternative embodiments of the present disclosure.

FIG. 7 is a cross-sectional view illustrating a semiconductor structure 30 according to some alternative embodiments of the present disclosure. The semiconductor structure 30 shown in FIG. 7 is similar to the semiconductor structure as shown in FIG. 6K. Only difference therebetween will be described, the same or the like parts will not be repeated again.

Referring to FIG. 6K and FIG. 7, the difference between the semiconductor structure 30 and the semiconductor structure 20 lies in that the topmost vias 226 of the semiconductor structure 30 are tapered toward the semiconductor die 202. In other words, the topmost vias 226 of the semiconductor structure 30 respectively have an inclined sidewall, and respectively have a width gradually decreasing toward the semiconductor die 202. For instance, an extending direction of such inclined sidewall is offset from a vertical direction by an angle ranging from 5° to 15°. In addition, an aspect ratio of each of these topmost vias 226 (i.e., a ratio of a height of the topmost vias 226 with respect to a width of the topmost vias 226) may range from 2 to 10.

As above, a process system for performing a dry etching process or a pre-cleaning process is provided. The process system includes a workpiece holding mechanism having a workpiece clamper, the workpiece can be firmly fixed by the workpiece clamper while being processed, even if the workpiece was subjected to warpage before entering the process system. As such, further warpage of the workpiece resulted from the dry etching process or the pre-cleaning process performed in the process system can be reduced. In some embodiments, a platen in the process system for supporting the workpiece has gas channels formed therein, and cooling gas can be provided to a back side of the workpiece through these gas channels. In this way, damages caused by the heat generated during the dry etching process or the pre-cleaning process can be minimized. Furthermore, in some embodiments, the process system is equipped with an APC module, such that the pressure in the process system can be precisely and dynamically controlled. In these embodiments, the dry etching process or the pre-cleaning process can be better controlled. For instance, profiles of vias formed by the dry etching process can be better defined.

In an aspect of the present disclosure, a workpiece holding mechanism is provided. The workpiece holding mechanism is used in a vacuum chamber and comprises a stage, a platen and a workpiece clamper. The platen is disposed over the stage, and configured to support a workpiece. The workpiece clamper is standing on the stage, and configured to clamp the workpiece from above the workpiece. The workpiece clamper comprises a plurality of supporting elements and an elevated structure. The plurality of supporting elements are connected between the stage and the elevated structure. The platen is surrounded by the plurality of supporting elements. The elevated structure is configured to physically contact a peripheral region of the workpiece from above the workpiece.

In another aspect of the present disclosure, a process system is provided. The process system comprises a chamber, a stage, a platen, a workpiece clamper and a platen shaft. The stage is enclosed in the chamber. The platen is disposed over the stage, and configured to support a workpiece. The workpiece clamper is standing on the stage, and configured to clamp the workpiece from above the workpiece. The workpiece clamper comprises an elevated structure and a plurality of supporting elements connected between the stage and the elevated structure. The platen is surrounded by the plurality of supporting elements. The elevated structure is configured to physically contact a peripheral region of the workpiece from above the workpiece. The platen shaft is penetrating through the stage, and configured to lift up or lower down the platen with respect to the stage.

In yet another aspect of the present disclosure, a manufacturing method of a semiconductor structure is provided. The manufacturing method of the semiconductor structure comprises: providing a workpiece comprising a carrier and a reconstructed wafer on the carrier, wherein the reconstructed wafer comprises at least one semiconductor die and an encapsulant laterally encapsulating the at least one semiconductor die; forming a polymer layer on the reconstructed wafer; forming a first mask layer on the polymer layer, wherein the first mask layer has a plurality of openings exposing portions of the polymer layer; entering the workpiece into a process system, wherein the process system comprises a stage, a platen and a workpiece clamper, the platen is disposed over the stage and configured to support the workpiece, the workpiece clamper is standing on the stage and configured to clamp the workpiece from above the workpiece by physically contacting a peripheral region of the workpiece; removing the exposed portions of the polymer layer by performing a dry etching process in the process system, to form a plurality of vias in the polymer layer; removing the first mask layer; and forming a plurality of conductive vias in the plurality of vias of the polymer layer, and forming a plurality of conductive traces over the polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A workpiece holding mechanism, used in a vacuum chamber, and comprising:
   a stage;
   a platen, disposed over the stage, and configured to support a workpiece; and
   a workpiece clamper, standing on the stage, and configured to clamp the workpiece from above the workpiece, wherein the workpiece clamper comprises a plurality of supporting elements and an elevated structure, the plurality of supporting elements are connected between the stage and the elevated structure, the platen is surrounded by the plurality of supporting elements, and the elevated structure is configured to physically contact a peripheral region of the workpiece from above the workpiece,
   wherein the workpiece clamper is coated with an insulating material.

2. The workpiece holding mechanism according to claim 1, wherein the elevated structure is formed in a ring shape.

3. The workpiece holding mechanism according to claim 2, wherein the elevated structure has a bottom portion and a top portion, an inner edge region of the bottom portion is overlapped with the peripheral region of the workpiece, the top portion is located on the bottom portion, and has a width less than a width of the bottom portion.

4. The workpiece holding mechanism according to claim 3, wherein the bottom portion has an inclined inner sidewall, obliquely facing away from a top surface of the platen.

5. The workpiece holding mechanism according to claim 3, the top portion and an outer region of the bottom portion are located outside a span of the platen.

6. The workpiece holding mechanism of claim 3, wherein the bottom portion is a first annular block, the top portion is a second annular block, the top portion is stacked on a flat region of the first annular block, and the flat region spans from the inner edge region to an outer edge of the elevated structure.

7. The workpiece holding mechanism according to claim 2, wherein the elevated structure has an inner edge region having a thickness decreasing toward a center of the elevated structure, and a remainder region of the elevated structure has a thickness substantially constant throughout the remainder region of the elevated structure.

8. The workpiece holding mechanism according to claim 2, wherein the elevated structure has a thickness decreasing from an outer edge of the elevated structure to an inner edge of the elevated structure.

9. The workpiece holding mechanism of claim 8, wherein the elevated structure has
   a flat bottom surface extending horizontally parallel to a top surface of the platen,
   a top surface facing the bottom surface and directly joining the bottom surface at the inner edge, and
   an outer surface vertically extending at the outer edge of the elevated structure to join the bottom surface to the top surface, wherein the top surface extends continuously inclined with respect to the bottom surface from the outer edge to the inner edge of the elevated structure.

10. The workpiece holding mechanism of claim 1, wherein the workpiece clamper is made of metal coated with the insulating material.

11. A process system, comprising:
    a chamber;
    a workpiece holding mechanism, comprising:
        a stage, enclosed in the chamber;
        a platen, disposed over the stage, and configured to support a workpiece; and
        a workpiece clamper, standing on the stage, and configured to clamp the workpiece from above the workpiece, wherein the workpiece clamper comprises an elevated structure and a plurality of supporting elements connected between the stage and the elevated structure, the platen is surrounded by the plurality of supporting elements, and the elevated structure is configured to physically contact a peripheral region of the workpiece from above the workpiece, wherein the workpiece clamper is coated with an insulating material; and
    a platen shaft, penetrating through the stage, and configured to lift up or lower down the platen with respect to the stage.

12. The process system according to claim 11, wherein a first gas channel is disposed in the platen, and a cooling gas is provided to a bottom side of the workpiece through the first gas channel.

13. The process system according to claim 12, wherein a second gas channel is disposed in the platen shaft, and communicated with the first gas channel in the platen.

14. The process system according to claim 11, further comprising a liquid cooling system, connected to the platen from outside the chamber, and configured to remove heat from the platen.

15. The process system according to claim 11, further comprising a pump and an automatic pressure control system connected between the chamber and the pump, the automatic pressure control system is configured to detect a pressure in the chamber, and to dynamically adjust a flow rate of the pump according to the detection result.

16. The process system according to claim 11, further comprising a plasma source, disposed at a sidewall of the chamber.

17. The process system according to claim 11, wherein the process system is configured to perform a pre-cleaning process or a dry-etching process on the workpiece.

18. A workpiece holding mechanism, used in a vacuum chamber, and comprising:
    a stage;

a platen, disposed over the stage, and configured to support a workpiece; and a workpiece clamper, standing on the stage, and configured to clamp the workpiece from above the workpiece, wherein the workpiece clamper comprises a plurality of supporting elements and an elevated structure, the plurality of supporting elements are connected between the stage and the elevated structure, the platen is surrounded by the plurality of supporting elements, and the elevated structure is configured to physically contact a peripheral region of the workpiece from above the workpiece, wherein the elevated structure comprises a bottom portion and a top portion stacked on the bottom portion, the bottom portion is a ring-shaped block having an inner edge region and a remainder region, the inner edge region has a thickness decreasing toward a center of the elevated structure, the remainder region is disposed between the inner edge region and an outer edge of the elevated structure, the remainder region has a thickness substantially constant throughout the remainder region of the bottom portion, and the top portion is a ring-shaped block disposed on the remainder region of the bottom portion and having a width less than a width of the bottom portion.

19. The workpiece holding mechanism of claim 18, wherein the inner edge region of the bottom portion has an inclined sidewall obliquely facing away from a top surface of the platen, and an angle between an extending direction of the inclined sidewall and a direction normal to the top surface of the platen is in a range from 45° to 75°.

20. The workpiece holding mechanism of claim 18, wherein the top portion is located outside a span of the platen, and the width of the top portion with respect to the width of the bottom portion is in a range from 1:4 to 1:8.

* * * * *